(12) United States Patent
Knudsen et al.

(10) Patent No.: US 9,185,828 B2
(45) Date of Patent: Nov. 10, 2015

(54) RACK MOUNTED ELECTRONICS HAVING CONNECTORS WITH HEAT COOLING FINGERS

(71) Applicant: Cray Inc., Seattle, WA (US)

(72) Inventors: Corey Knudsen, Menomonie, WI (US); Kent T. McDaniel, Altoona, WI (US); Bradley J. Smith, Eau Claire, WI (US); Gregory W. Pautsch, Hayward, WI (US); Eric D. Lakin, Chippewa Falls, WI (US)

(73) Assignee: Cray Inc., Seattle, WA (US)

(*) Notice: Subject to any disclaimer, the term of this patent is extended or adjusted under 35 U.S.C. 154(b) by 311 days.

(21) Appl. No.: 13/836,873

(22) Filed: Mar. 15, 2013

(65) Prior Publication Data
US 2013/0301219 A1 Nov. 14, 2013

Related U.S. Application Data

(63) Continuation-in-part of application No. 13/681,188, filed on Nov. 19, 2012.

(60) Provisional application No. 61/561,240, filed on Nov. 17, 2011.

(51) Int. Cl.
H05K 7/20 (2006.01)

(52) U.S. Cl.
CPC ........ *H05K 7/20681* (2013.01); *H05K 7/20154* (2013.01); *H05K 7/20336* (2013.01); *H05K 7/20818* (2013.01)

(58) Field of Classification Search
CPC ............ G06F 1/20; G06F 1/203; G06F 1/181–1/189; G02B 6/4201
USPC ........................ 361/679.46–679.54, 688–723; 439/485–487
See application file for complete search history.

(56) References Cited

U.S. PATENT DOCUMENTS

| | | | |
|---|---|---|---|
| 5,946,191 A * | 8/1999 | Oyamada | 361/700 |
| 6,580,609 B2 | 6/2003 | Pautsch | |
| 6,646,879 B2 | 11/2003 | Pautsch | |
| 6,796,370 B1 | 9/2004 | Doll | |
| 6,835,070 B1 | 12/2004 | Law | |
| 7,017,059 B2 | 3/2006 | Law et al. | |
| 7,106,595 B2 * | 9/2006 | Foster et al. | 361/721 |
| 7,219,247 B2 | 5/2007 | Law et al. | |
| 7,304,842 B2 | 12/2007 | Yatskov | |

(Continued)

FOREIGN PATENT DOCUMENTS

EP 1388277 B1 7/2010

*Primary Examiner* — Zachary M Pape
(74) *Attorney, Agent, or Firm* — Craig J. Lervick; Larkin Hoffman Daly & Lindgren, Ltd.

(57) ABSTRACT

A system and method for cooling a plurality of connectors interfacing electrical and optical signals to circuit boards in an electronics cabinet, such as backplane connectors routing signals to circuit boards housed in card cage assemblies. Heat pipes coupled to the connectors efficiently remove heat from the connectors and sink the connector heat to a cold junction of a liquid cooling system, which cooling system may also extract heat from air flow cooling the circuit boards such that the system is room neutral, meaning that the ambient temperature remains constant during operation of the system. The heat connector cooling system is effective where connectors are outside of an air flow cooling envelope that may cool the circuit boards.

22 Claims, 19 Drawing Sheets

(56) References Cited

U.S. PATENT DOCUMENTS

| | | |
|---|---|---|
| 7,314,113 B2 | 1/2008 | Doll |
| 7,330,350 B2 | 2/2008 | Hellriegel et al. |
| 7,362,571 B2 | 4/2008 | Kelley et al. |
| 7,411,785 B2 | 8/2008 | Doll |
| 7,478,769 B1 | 1/2009 | Pautsch et al. |
| 7,630,198 B2 | 12/2009 | Doll |
| 7,757,497 B1 | 7/2010 | Pautsch et al. |
| 7,898,799 B2 | 3/2011 | Doll |
| 7,903,403 B2 | 3/2011 | Doll et al. |
| 8,116,080 B2 | 2/2012 | Wormsbecher et al. |
| 8,449,203 B2 * | 5/2013 | Downs ............... 385/92 |
| 8,520,387 B2 | 8/2013 | Chen et al. |
| 8,526,182 B2 | 9/2013 | Chen et al. |
| 2004/0264133 A1 * | 12/2004 | Fukuda et al. ............ 361/695 |
| 2006/0089042 A1 * | 4/2006 | Lawton et al. ............ 439/485 |
| 2007/0064397 A1 * | 3/2007 | Chiba et al. ............ 361/702 |
| 2008/0123288 A1 | 5/2008 | Hillis |
| 2008/0232064 A1 | 9/2008 | Sato et al. |
| 2009/0122483 A1 | 5/2009 | Hall |
| 2009/0207567 A1 | 8/2009 | Campbell et al. |
| 2009/0260777 A1 | 10/2009 | Attlesey |
| 2011/0157829 A1 | 6/2011 | Wormsbecher et al. |
| 2012/0100763 A1 | 4/2012 | Steinfeld |
| 2012/0113592 A1 | 5/2012 | Chen |
| 2012/0127655 A1 | 5/2012 | Tung et al. |
| 2013/0291368 A1 * | 11/2013 | Davidson ............ 29/592.1 |
| 2014/0247555 A1 * | 9/2014 | Arvelo et al. ............ 361/699 |

\* cited by examiner

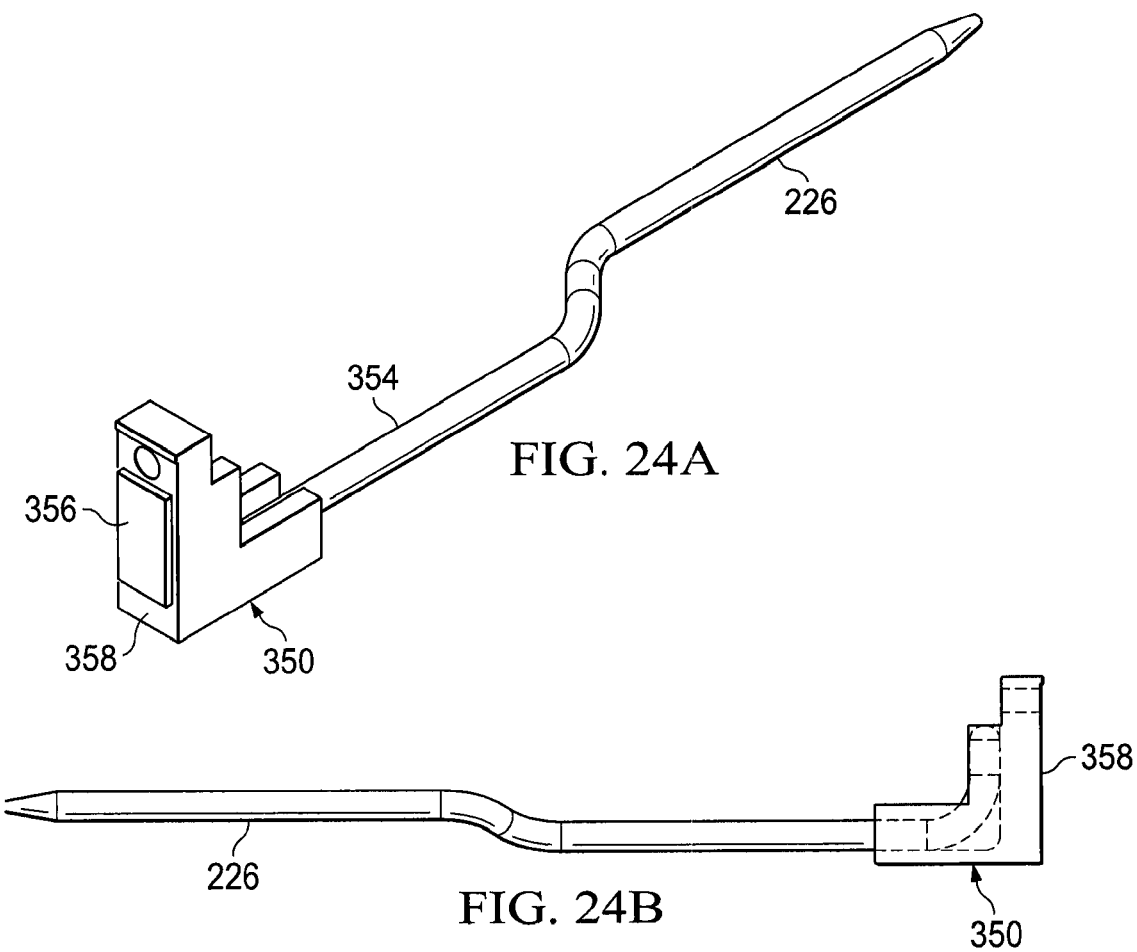
FIG. 24A
FIG. 24B
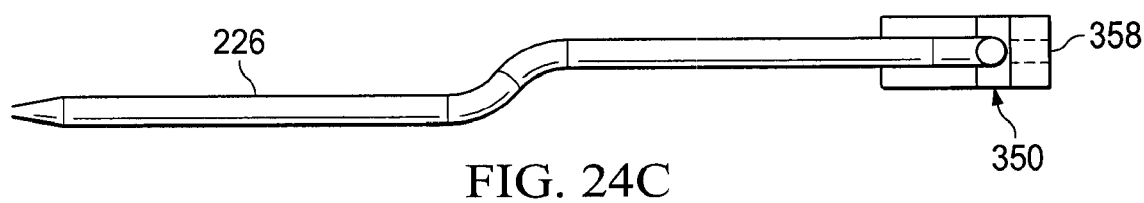
FIG. 24C
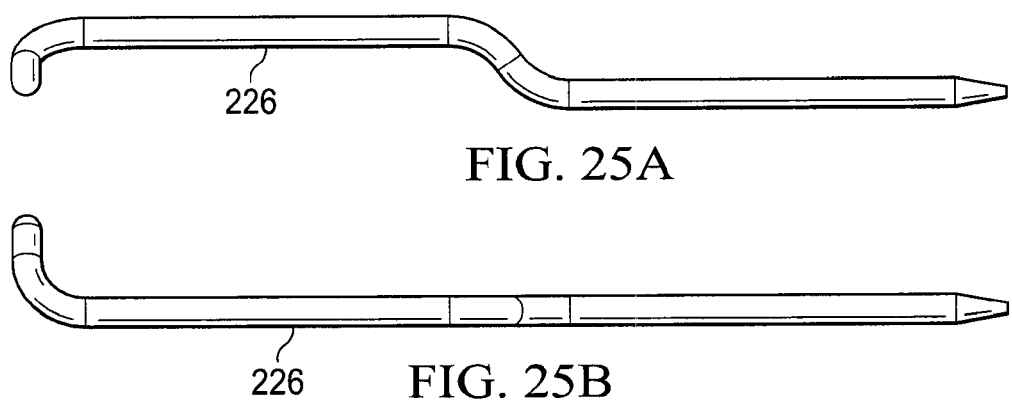
FIG. 25A
FIG. 25B

RACK MOUNTED ELECTRONICS HAVING CONNECTORS WITH HEAT COOLING FINGERS

CLAIM OF PRIORITY

This application is a continuation-in-part of U.S. application Ser. No. 13/681,188 filed Nov. 19, 2012 entitled Transverse Cooling System and Method, which claims priority of U.S. Provisional Patent Application Ser. No. 61/561,240 filed Nov. 17, 2011 entitled Transverse Cooling System and Method.

GOVERNMENT RIGHTS

This invention was made with U.S. Government support under Agreement No. HR0011-07-9-0001 awarded by DARPA. The U.S. Government has certain rights in this invention.

FIELD OF THE INVENTION

The present invention is related to systems for cooling electronics, and more particularly to cabinet mounted electronics assemblies such as rack mounted circuit boards.

BACKGROUND INFORMATION

Conventionally, electronics cabinets such as those with rack mounted electronics, such as circuit boards and connectors, are cooled by directing cooled air vertically up through the cabinet. The cooled air typically enters the cabinet at or near the floor and the heated air exits at or near the top of the cabinet. Circuit boards are arranged vertically such that air flows bottom to top along the surfaces of the circuit boards, taking advantage of the fact that hot air rises. Electrical and optical connectors are sometimes cooled by such airflow, depending on the configuration.

Cabinets including electronics that are cooled in this manner exhibit a significant caloric rise from bottom to top as the circulated air heats draws heat from each of the electronics in its path. Notably, the distance the air travels vertically through a tall cabinet significantly reduces the cooling efficiency of the upper electronics. Moreover, the cooling efficiency drops further due to the pressure drop from the bottom to the top of the cabinet.

In addition, such a cooling approach is often complex and expensive. Air conditioning may be needed to cool the air before it enters the cabinet. If the heat rise of the circulated air up through the cabinet is large, intercooler assemblies may be placed between electronics assemblies to extract heat from the vertically directed air between each assembly. Intercooler assemblies sometimes include a refrigerant or a liquid such as water to aid in extracting heat from the air passing through the intercooler assembly. Such approaches increase the heat generated by the cabinet, further reducing the power usage efficiency (PUE) of the unit.

Connectors, including backplane connectors interfacing electrical and optical signals into a card cage assembly including the circuit boards, also generate a significant source of heat during operation. Both wired and optical connectors can generate between 2 to 10 Watts of heat each in some configurations, which cumulative heat significantly increases the temperature within the cabinets and also the ambient. This heat generated by the connectors is not typically efficiently cooled or expelled from the cabinet because the connectors are not located in the cooling envelope of the air flow. While air flow may be provided across the circuit boards, the connectors extending through the backplanes interfacing with the circuit boards significantly extend behind the backplane and the card cage assembly, and may generate heat in a space or cavity defined between the backplane and the cabinet rear wall, or are exposed to the ambient.

What is needed is a system and method that addresses these issues and other issues that will become apparent in reading below.

BRIEF DESCRIPTION OF THE DRAWINGS

FIG. 24A is a perspective view of a left hand heat pipe attached to a cold junction bracket including a thermal filler, FIG. 24B is a side view of the heat pipe and cold junction bracket of FIG. 24A, and FIG. 24C is a top view of the heat pipe and cold junction bracket of FIG. 24A; and FIG. 25A is a side view of the heat pipe of FIG. 24A, and FIG. 25B is another view of the heat pipe of FIG. 24A.

DETAILED DESCRIPTION OF THE INVENTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

FIGS. 1-9 depict various embodiments of room neutral electronics systems according to preferred embodiments of the invention.

Figure 1:
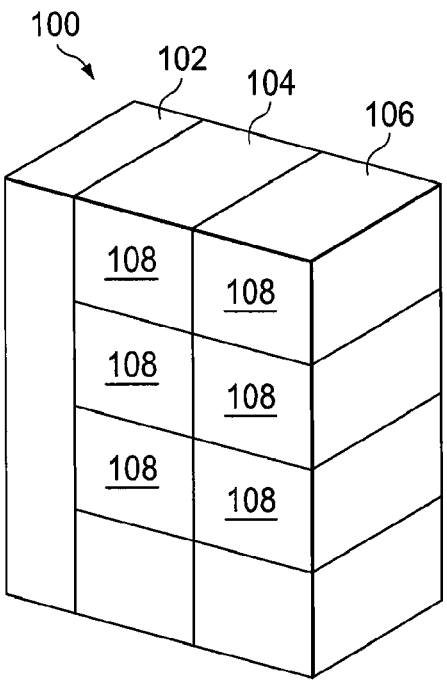
FIG. 1 illustrates an electronics system with transverse cooling.

An electronics system with transverse cooling is shown in FIG. 1. In electronics system 100 of FIG. 1, a blower system 102 blows air horizontally across electronics assemblies positioned in cabinets 104 and 106. In the example shown, each cabinet includes three electronics chassis 108. Each electronics chassis 108 includes one or more electronics assemblies (not shown) oriented substantially horizontally in chassis 108. In addition, each chassis 108 and each cabinet 104 is open to the first and second side to the extent necessary to receive air and direct that air across each of the plurality of electronics assemblies.

In the embodiment shown in FIG. 1, blower system 102 is positioned adjacent to the first side of the first cabinet and the second cabinet is positioned on the opposite side of the first cabinet. The electronics assemblies are cooled by actuating the blower system such that blower system 102 directs air into the first cabinet. The air flows substantially horizontally through the side of the first cabinet 104 and across each of the plurality of electronics assemblies within the first cabinet 104 before entering the second cabinet 106 and flowing substantially horizontally across each of the plurality of electronics assemblies of the second cabinet 106 before exiting the second cabinet 106.

In another embodiment, electronics assemblies are cooled by actuating the blower system such that blower system 102 draws air from the first cabinet. The air flows substantially horizontally through the side of the second cabinet 106 and across each of the plurality of electronics assemblies within the second cabinet 106 before entering the first cabinet 104 and flowing substantially horizontally across each of the plurality of electronics assemblies of the first cabinet 104.

Figure 2A:
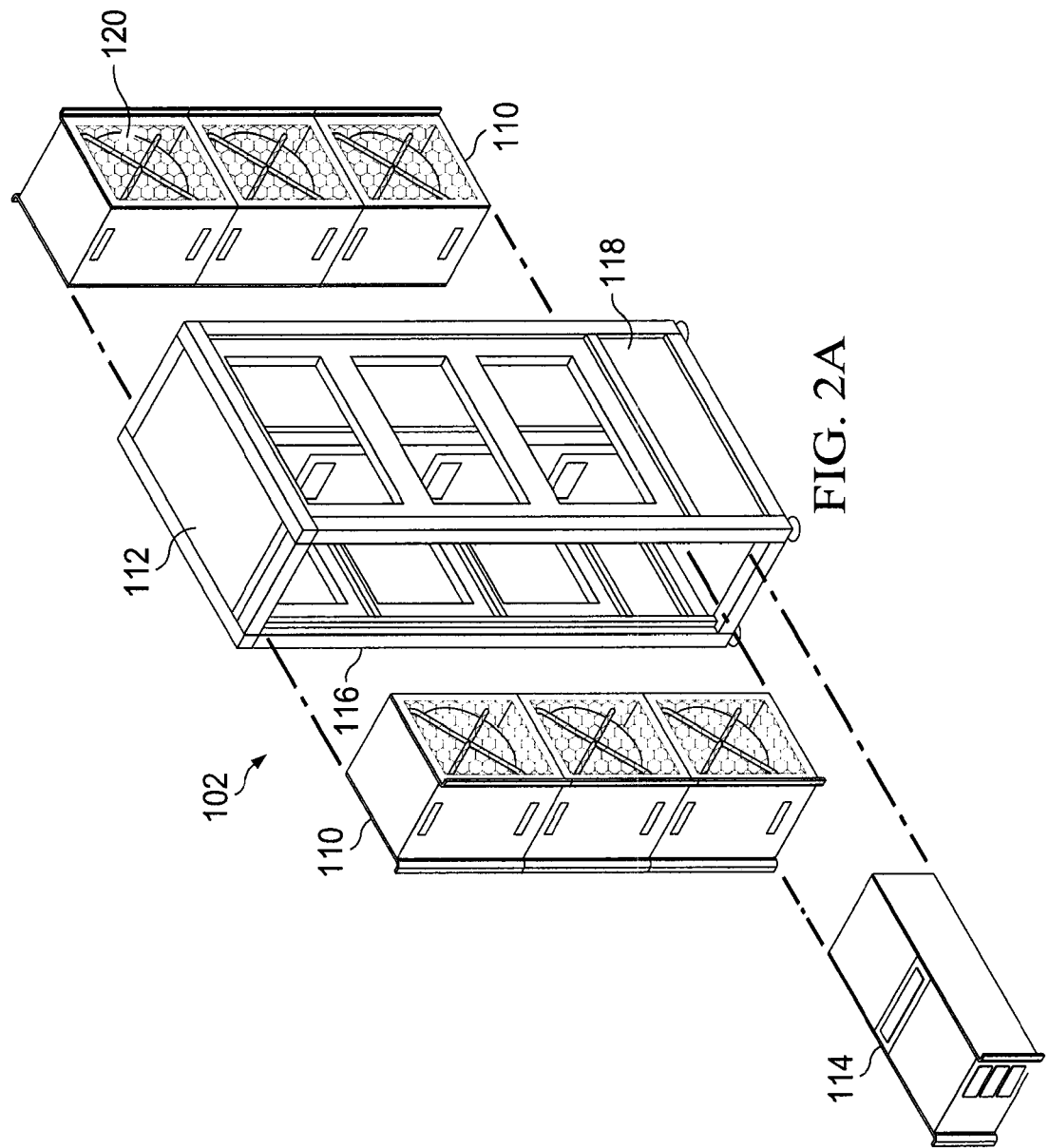
FIG. 2A s an exploded view of a blower assembly that can be used in the electronics systems of FIG. 1.

A blower system 102 is shown in FIG. 2A. In the blower system of FIG. 2A, one or more blower assemblies 110 are positioned in a frame assembly 112. In the embodiment shown in FIG. 2A, each blower assembly 110 includes three blowers 120 stacked vertically. A power unit 114 is mounted under blower assembly 110. In one embodiment, blower system also includes a side panel inlet/exhaust 116 used to prevent objects from entering blower assembly 110 and a frame joiner 118 used to connect blower system 102 to a respective cabinet.

Figure 2B:
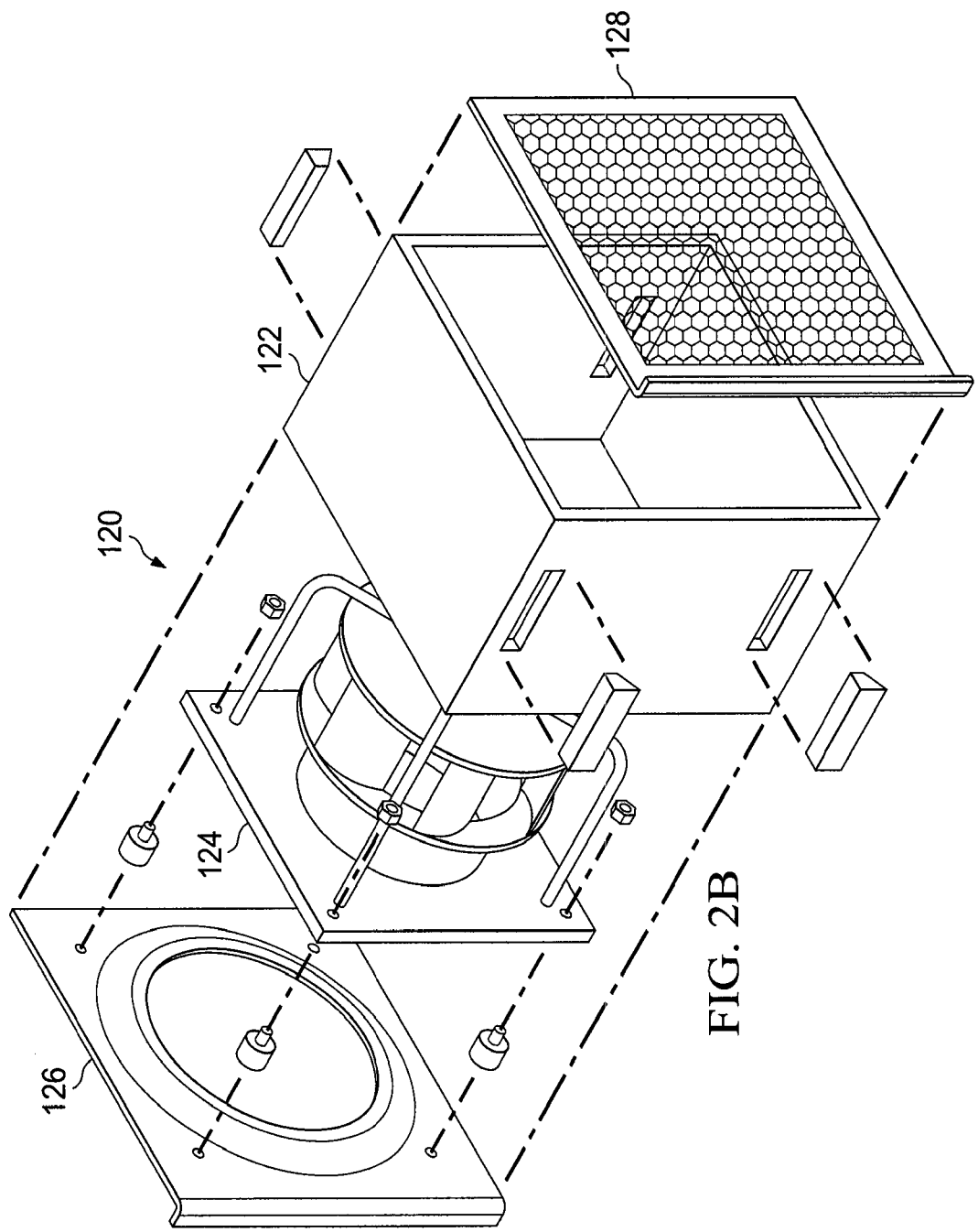
FIG. 2B illustrates an exploded view of a fan assembly that can be used in the blower assembly of FIG. 2A.

FIG. 2B provides an exploded view of one embodiment of a blower 120 that can be mounted in blower assembly 110. Blower 120 includes a blower frame 122, a fan 124, a cover 126 and a grill 128. In one embodiment, blower 120 is designed to be hot-swappable and is wired to indicate failure.

Figure 3:
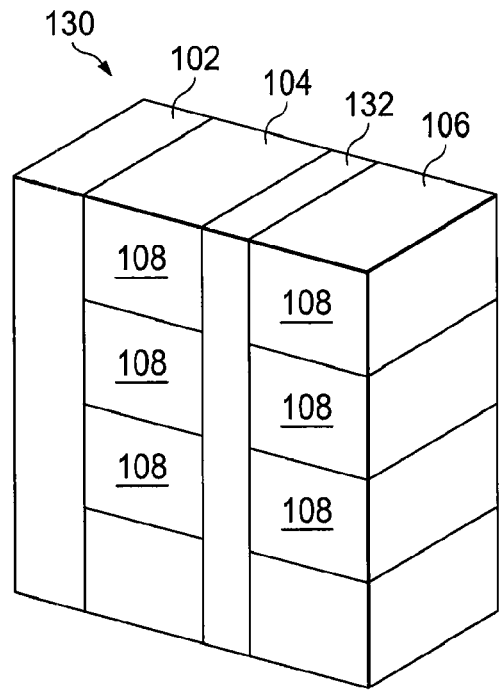
FIG. 3 illustrates an electronics system with an alternate transverse cooling approach.
Figure 9:
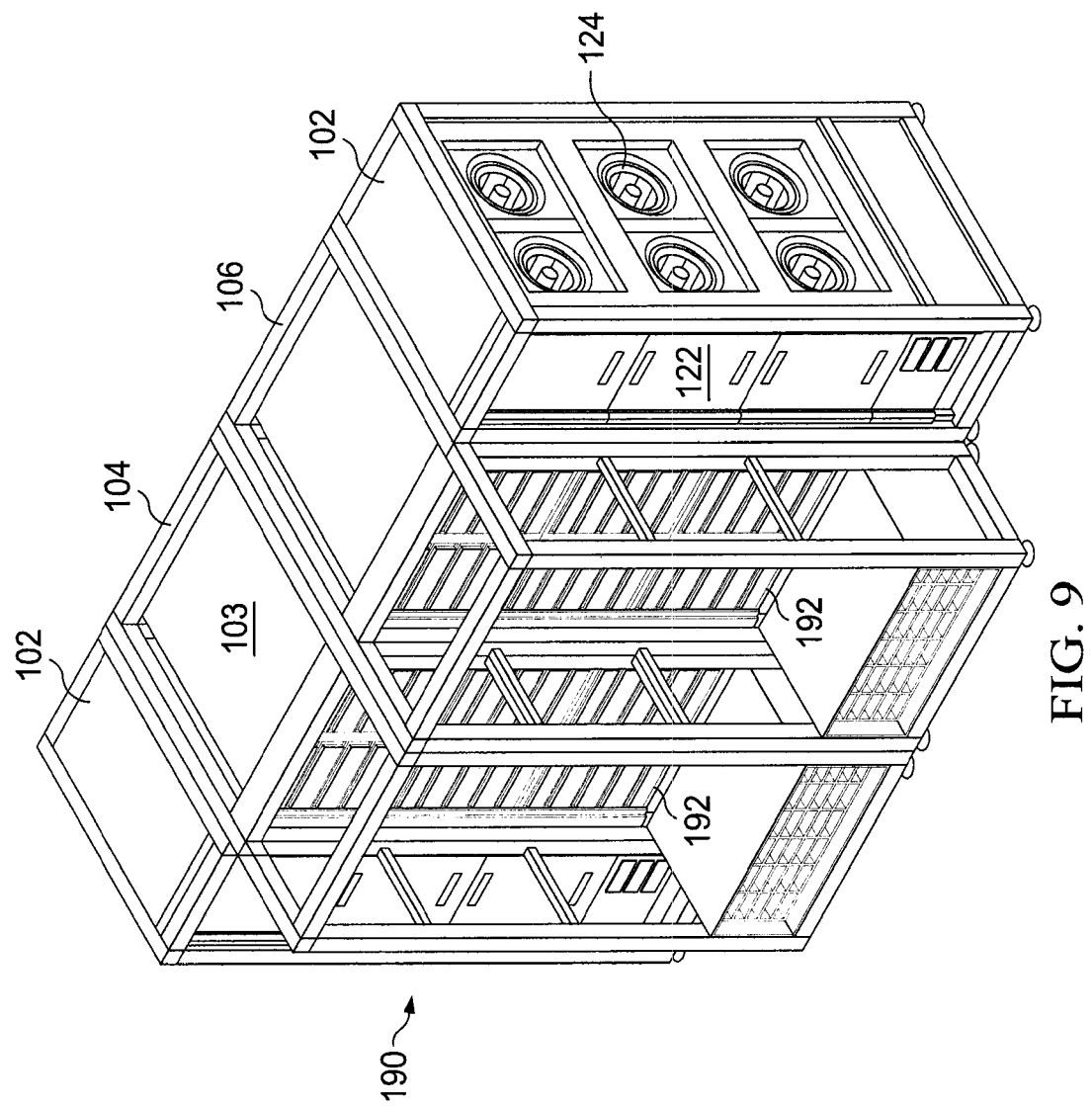
FIG. 9 illustrates an electronics system with yet another transverse cooling approach.

Another example electronics system with transverse cooling is shown in FIG. 3. In electronics system 130 of FIG. 3, a blower system 102 blows air horizontally across electronics assemblies positioned in cabinets 104 and 106. Each electronics assembly is oriented substantially horizontally in cabinet 104 and 106, as shown in FIG. 9 which will be described in more detail shortly. In addition, each cabinet 104 and 106 is open to the first and second side to the extent necessary to receive air and direct that air across each of the plurality of electronics assemblies. An intercooler 132 is positioned between the first cabinet 104 and the second cabinet 106 and is configured to cool air as it passes through intercooler 132 before entering the next cabinet 106. Intercooler 132, as implemented and described in many embodiments of the invention hereafter, is preferably a coiled assembly configured to draw heat from air circulated therethrough into a fluid circulated through the coiled assembly, as will be discussed further in regards to FIGS. 11-14.

In the embodiment shown in FIG. 3, blower system 102 is positioned adjacent to the first side of the first cabinet 104 and the second cabinet is positioned on the opposite side of the first cabinet. The electronics assemblies are cooled by actuating the blower system such that blower system 102 directs air into the first cabinet. The air flows substantially horizontally through the side of the first cabinet 104 and across each of the plurality of electronics assemblies within the first cabinet 104b before entering intercooler 132. The air is cooled in intercooler 132 and then passes into the second cabinet 106, flowing substantially horizontally across each of the plurality of electronics assemblies of the second cabinet 106 before exiting the second cabinet 106.

In another embodiment, electronics assemblies in each cabinet 104 and 106 of FIG. 3 are cooled by actuating the blower system such that blower system 102 draws air from the first cabinet. The air flows substantially horizontally through the side of the second cabinet 106 and across each of the plurality of electronics assemblies within the second cabinet 106 before entering intercooler 132. The air is cooled in intercooler 132 and then passes into the first cabinet 104, flowing substantially horizontally across each of the plurality of electronics assemblies of the first cabinet 104, before being drawn into blower 102.

Figure 4:
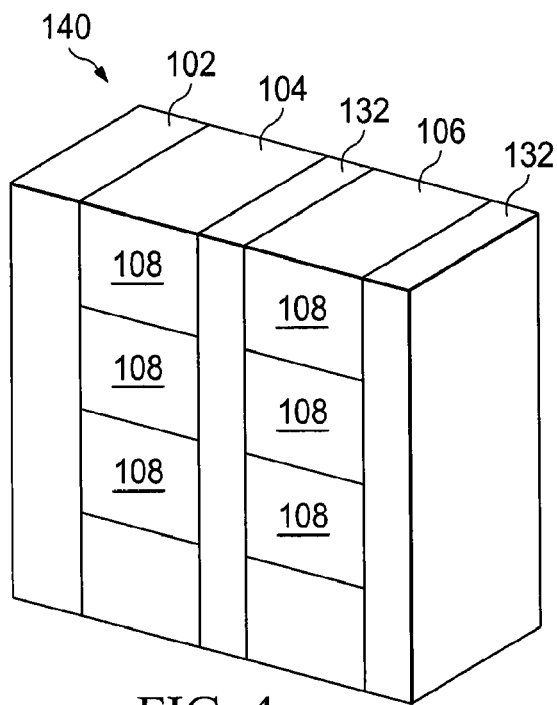
FIG. 4 illustrates an electronics system with yet another transverse cooling approach.

Another example electronics system with transverse cooling is shown in FIG. 4. In electronics system 140 of FIG. 4, a blower system 102 blows air horizontally across electronics assemblies positioned in cabinets 104 and 106. Each electronics assembly is oriented substantially horizontally in respective cabinet 104 and 106. In addition, each cabinet 104 and 106 is open to the first and second side to the extent necessary to receive air and direct that air across each of the plurality of electronics assemblies. An intercooler 132 inserted between the first cabinet 104 and second cabinet 106 and is configured to cool air as it passes through intercooler 132 before entering the next cabinet 106. A second intercooler 132 is configured to cool the air exiting cabinet 106.

In the embodiment shown in FIG. 4, blower system 102 is positioned adjacent to the first side of the first cabinet and the second cabinet is positioned on the opposite side of intercooler 132. The electronics assemblies are cooled by actuating the blower system such that blower system 102 directs air into the first cabinet 104. The air flows substantially horizontally through the side of the first cabinet 104 and across each of the plurality of electronics assemblies within the first cabinet 104 before entering intercooler 132. The air is cooled in intercooler 132 and then passes into the second cabinet 106, flowing substantially horizontally across each of the plurality of electronics assemblies of the second cabinet 106 before exiting the second cabinet and entering intercooler 132.

In another embodiment, electronics assemblies in each cabinet 104 and 106 of FIG. 4 are cooled by actuating the blower system such that blower system 102 draws air from the first cabinet 104. The air is drawn through intercooler 132. The air then flow substantially horizontally through the side of the second cabinet 106 and across each of the plurality of electronics assemblies within the second cabinet 106 before entering intercooler 132. The air is cooled in intercooler 132 and then passes into the first cabinet 104, flowing substantially horizontally across each of the plurality of electronics assemblies of the first cabinet 104 before being drawn into blower 102.

Figure 5:
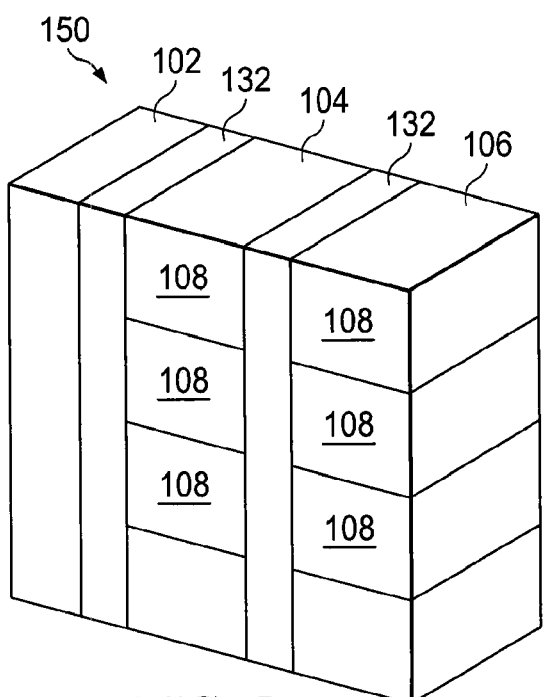
FIG. 5 illustrates an electronics system with yet another transverse cooling approach.

Another example electronics system with transverse cooling is shown in FIG. 5. In electronics system 150 of FIG. 5, a blower system 102 blows air horizontally across electronics assemblies positioned in cabinets 104 and 106. Each electronics assembly is oriented substantially horizontally in the respective cabinet 104 and 106. In addition, each cabinet 104 and 106 is open to the first and second side to the extent necessary to receive air and direct that air across each of the plurality of electronics assemblies. An intercooler 132 inserted between blower system 102 and cabinet 104 cools air as it passes through intercooler 132. An intercooler 132 inserted between the first cabinet 104 and the second cabinet 106 cools air as it passes through intercooler 132 before entering the next cabinet 106.

In the embodiment shown in FIG. 5, intercooler 132 is located between blower system 102 and cabinet 104. The electronics assemblies in cabinet 104 are cooled by actuating the blower system such that blower system 102 directs air through intercooler 132 into the first cabinet. The air flows substantially horizontally through the side of the first cabinet 104 and across each of the plurality of electronics assemblies within the first cabinet 104 before entering intercooler 132. The air is cooled in intercooler 132 and then passes into the second cabinet 106, flowing substantially horizontally across each of the plurality of electronics assemblies of the second cabinet 106 before exiting the second cabinet.

In another embodiment, electronics assemblies in each cabinet 104 of FIG. 5 are cooled by actuating the blower system such that blower system 102 draws air through intercooler 132 from the first cabinet 104. The air is drawn initially through intercooler 132 from cabinet 106. The air through cabinet 106 flows substantially horizontally through the side of the second cabinet 106 and across each of the plurality of electronics assemblies within the second cabinet 106 before entering intercooler 132. The air is cooled in intercooler 132 and then passes into the first cabinet 104, flowing substantially horizontally across each of the plurality of electronics assemblies of the first cabinet 104, before being drawn into blower 102.

Figure 6:
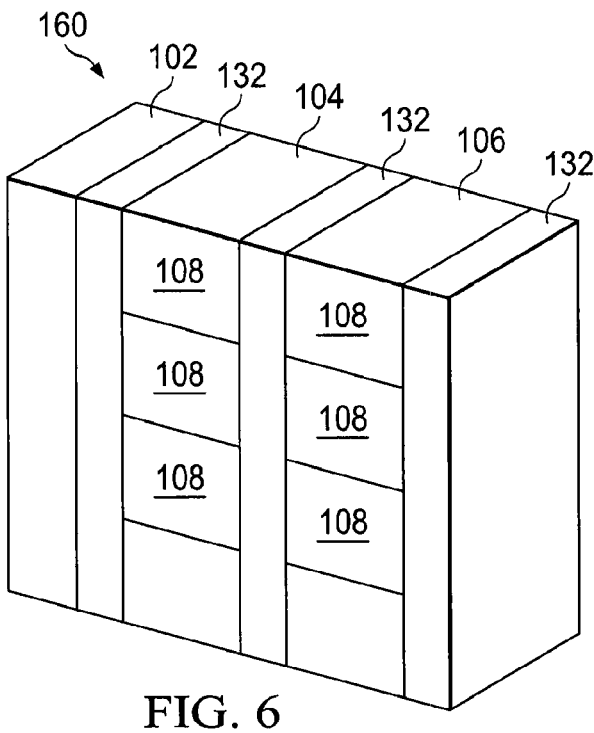
FIG. 6 illustrates an electronics system with yet another transverse cooling approach.

Another example electronics system with transverse cooling is shown in FIG. 6. In electronics system 160 of FIG. 6, an additional intercooler 132 is added to system 160 of FIG. 5. In one embodiment, blower system 102 blows air horizontally across electronics assemblies positioned in cabinets 104 and 106. Each electronics assembly is oriented substantially horizontally in respective cabinet 104 and 106. In addition, each cabinet 104 and 106 is open to the first and second side to the extent necessary to receive air and direct that air across each of the plurality of electronics assemblies. An intercooler 1321 inserted between blower system 102 and cabinet 104 cools air as it passes through intercooler 132. An intercooler 132 inserted between the first cabinet 104 and second cabinet 106 cools air as it passes through intercooler 132 before entering the next cabinet 106.

In the embodiment shown in FIG. 6, the third intercooler 132 is added to one side of cabinet 106. In one such embodiment, air blown through cabinet 106 passes through third intercooler 132 before being vented to the room In another embodiment, electronics assemblies in each cabinet 104 and 106 of FIG. 6 are cooled by actuating the blower system such that blower system 102 draws air through intercooler 132 from the first cabinet 104. In such an embodiment, the third intercooler 132 cools the air before passing it on to cabinet 106.

Figure 7:
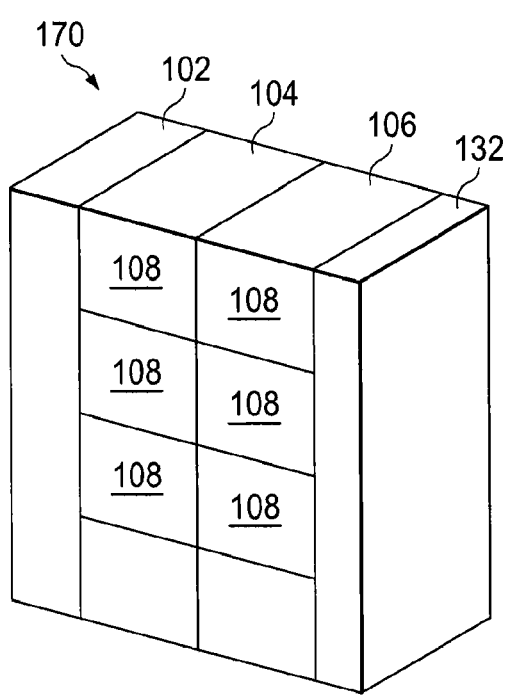
FIG. 7 illustrates an electronics system with yet another transverse cooling approach.

Another example electronics system with transverse cooling is shown in FIG. 7. In electronics system 170 of FIG. 7, a blower system 102 blows air horizontally across electronics assemblies positioned in cabinets 104 and 106. Each electronics assembly is oriented substantially horizontally in respective cabinet 104 and 106. In addition, each cabinet 104 and 106 is open to the first and second side to the extent necessary to receive air and direct that air across each of the plurality of electronics assemblies. An intercooler 132 mounted on the other side of cabinet 106 cools the air exiting cabinet 106.

In the embodiment shown in FIG. 7, blower system 102 is positioned adjacent to the first side of the first cabinet, and the second cabinet is positioned on the opposite side of the first cabinet. The electronics assemblies are cooled by actuating the blower system such that blower system 102 directs air into the first cabinet 104. The air flows substantially horizontally through the side of the first cabinet 104 and across each of the plurality of electronics assemblies within the first cabinet 104 before entering cabinet 106 The air flows substantially horizontally across each of the plurality of electronics assemblies of the second cabinet 106 before exiting the second cabinet and entering intercooler 132.

In another embodiment, electronics assemblies in each cabinet 104 and 106 of FIG. 7 are cooled by actuating the blower system such that blower system 102 draws air from the first cabinet 104. The air is drawn through adjacent intercooler 132. The air then flow substantially horizontally through the side of the second cabinet 106 and across each of the plurality of electronics assemblies within the second cabinet 106 before passing into the first cabinet 104. The air then flows substantially horizontally across each of the plurality of electronics assemblies of the first cabinet 104, before being drawn into blower 102.

Figure 8:
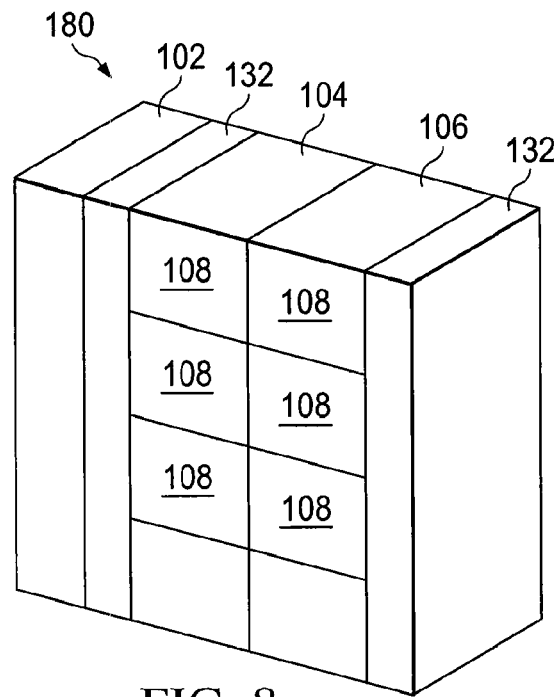
FIG. 8 illustrates an electronics system with yet another transverse cooling approach.

Another example electronics system with transverse cooling is shown in FIG. 8. In electronics system 180 of FIG. 8, an intercooler 132 is placed in between blower 102 and cabinet 104 of FIG. 7.

In the embodiment shown in FIG. 8, intercooler 132 is placed between blower system 102 and first cabinet 104. The electronics assemblies are cooled by actuating the blower system such that blower system 102 directs air through intercooler 132 and into the first cabinet 104. The air flows substantially horizontally through the side of the first cabinet 104 and across each of the plurality of electronics assemblies within the first cabinet 104 before entering cabinet 106. The air flows substantially horizontally across each of the plurality of electronics assemblies of the second cabinet 106 before exiting the second cabinet and entering adjacent intercooler 132.

In another embodiment, electronics assemblies in each cabinet 104 and 106 of FIG. 8 are cooled by actuating the blower system such that blower system 102 draws air through intercooler 132 from the first cabinet 104. The air is drawn through adjacent intercooler 132, flowing substantially horizontally through the side of the second cabinet 106.2 and across each of the plurality of electronics assemblies within the second cabinet 106 before passing into the first cabinet 104. The air then flows substantially horizontally across each of the plurality of electronics assemblies of the first cabinet 104, before being drawn through intercooler 132 and into blower 102.

Another example electronics system with transverse cooling is shown in FIG. 9. In electronics system 190 of FIG. 9, a blower system 102 blows air horizontally across electronics assemblies 192 positioned in respective chassis 103 in each of cabinets 104 and 106. Each electronics assembly 192 is oriented substantially horizontally in its chassis 103 in cabinet 104 and 106. In addition, each cabinet 104 is open to the first and second side to the extent necessary to receive air and direct that air across each of the plurality of electronics assemblies. A second blower system 102 mounted on the other side of cabinet 106 draws air from cabinet 106.

In another embodiment, electronics assemblies in each cabinet 104 and 106 of FIG. 9 are cooled by actuating both blower systems 102 such that the first blower system 102 draws air from the first cabinet 104 while the second blower system 102 blows air into cabinet 106. The air flows substantially horizontally through the side of the second cabinet 106 and across each of the plurality of electronics assemblies within the second cabinet 106 before passing into the first cabinet 104. The air then flows substantially horizontally across each of the plurality of electronics assemblies of the first cabinet 104, before being drawn into first blower 102.

Figure 10:
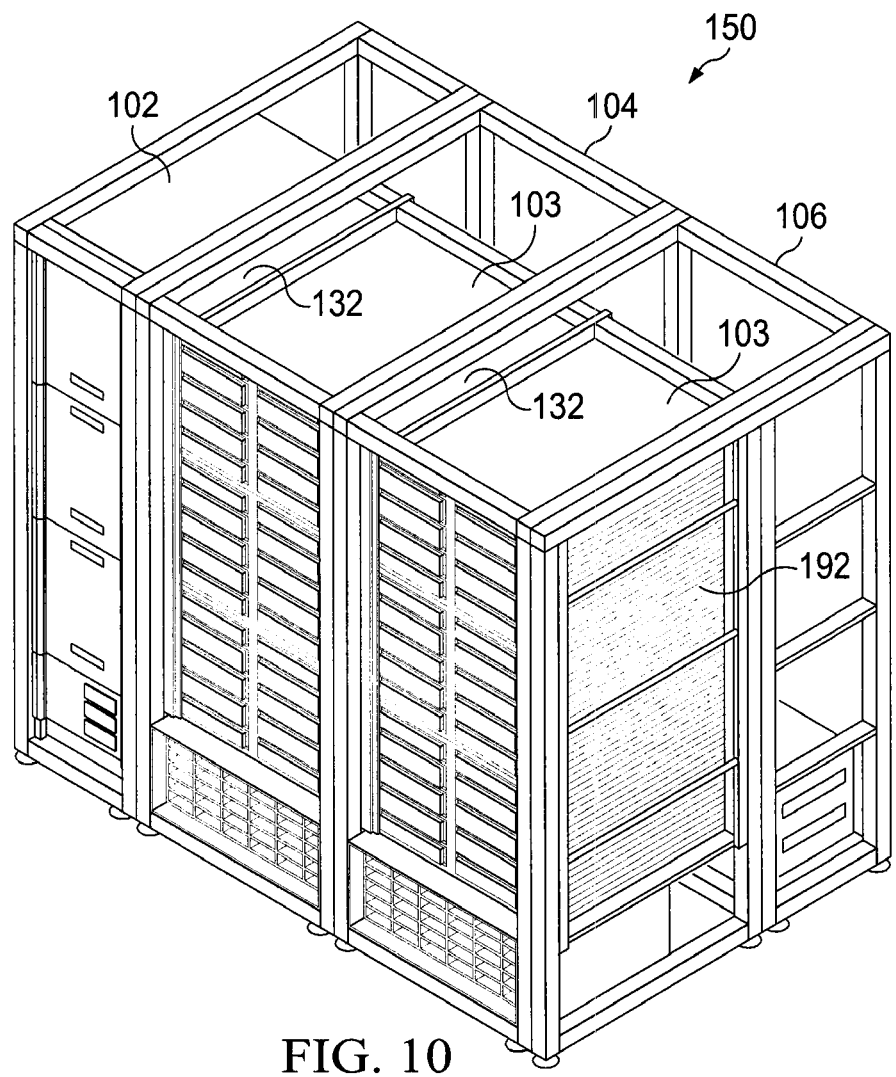
FIG. 10 illustrates one example embodiment of the system of FIG. 5.

A more detailed example of electronics system 150 of FIG. 5 is shown in FIG. 10. In electronics system 150 of FIG. 10, blower system 102 blows air horizontally across each electronics assembly 192 horizontally positioned in respective chassis 103 of cabinets 104 and 106. Each cabinet 104 and 106 has open first and second sides configured to receive and direct cooled air horizontally across each of the plurality of electronic assemblies 192, and expel the heated air. The first intercooler 132 is shown inserted between blower system 102 and first cabinet 104 and cools air as it passes air from the blower system 102 through first intercooler 132. The second intercooler 132 inserted between the first cabinet 104 and second cabinet 106 cools air as it passes through the second intercooler 132 before entering the next cabinet 106.

In another embodiment, electronic assemblies 192 in each cabinet 104 and 106 of FIG. 10 are cooled by actuating the blower system such that blower system 102 draws air through the first intercooler 132 from the first cabinet 104. The air is drawn initially through the second intercooler cabinet 106 and the second intercooler 132. The air through cabinet 106 flows substantially horizontally through the side of the second cabinet 106 and across each of the plurality of electronic assemblies 192 within the second cabinet 106 before entering the second intercooler 132. The air is cooled in the second intercooler 132 and then passes into the first cabinet 104, flowing substantially horizontally across each of the plurality of electronic assemblies 192 of the first cabinet 104, before being drawn into blower 102.

Advantageously, by directing air horizontally across electronics assemblies 192 mounted horizontally in the respective cabinets, the invention takes advantage of the decreased path length of air flow across the cabinets, such that the temperature gradient is reduced across the electronics assemblies 192 resulting in a higher efficiency cooling system. Further, the pressure drop of the cooing air from side to side is reduced, allowing the implementation of less powerful fans and less expensive fans in blower 102 to achieve the desired cooling. The cooling system is configured such that the electronics system is room neutral, meaning the temperature of the air expelled from the cooled system is the same as the ambient air drawn into the cooling system, as will now be described in more detail.

Figure 11:
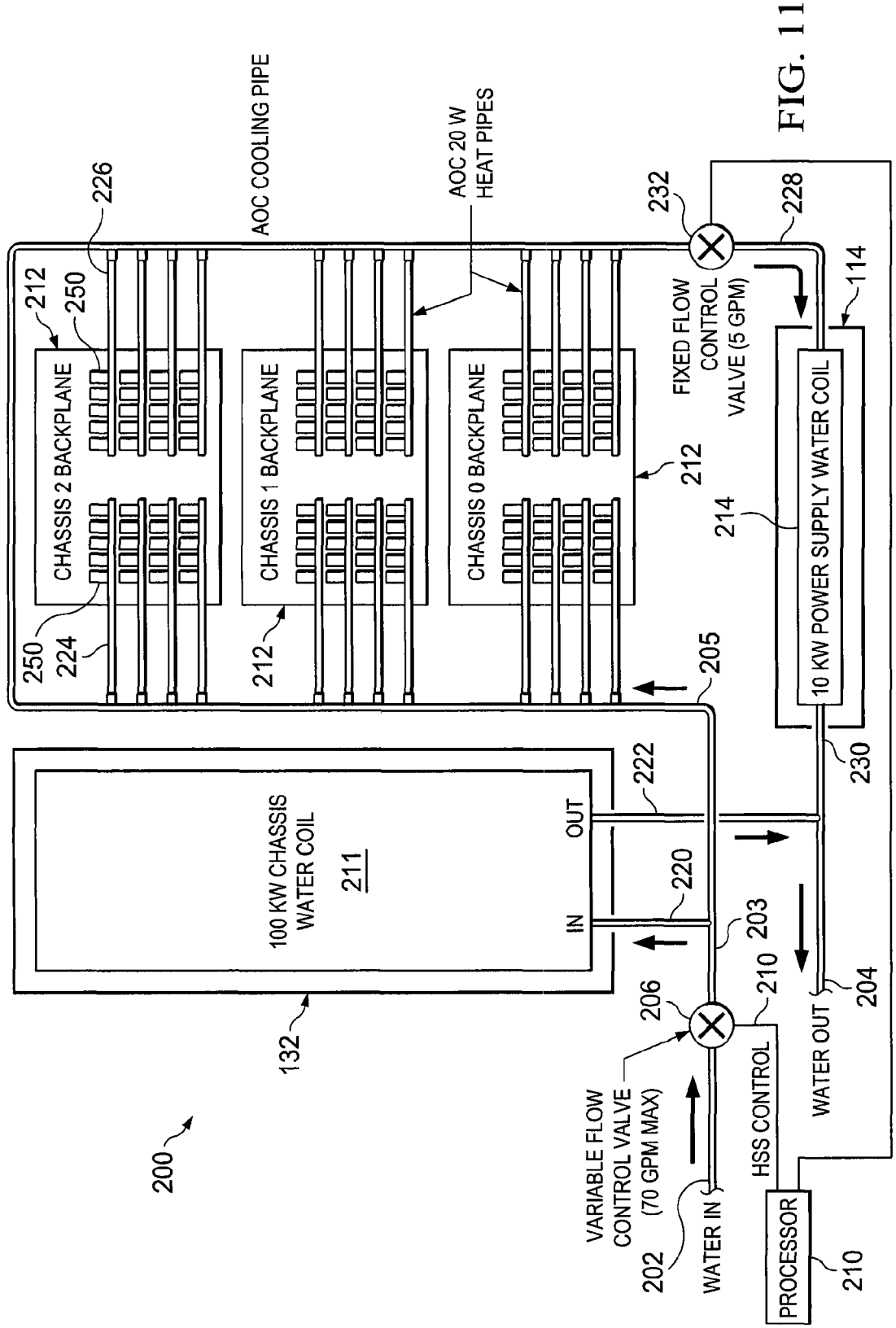
FIG. 11 depicts a system diagram of the cooling system including a map of the circulated cooling fluid.
Figure 12:
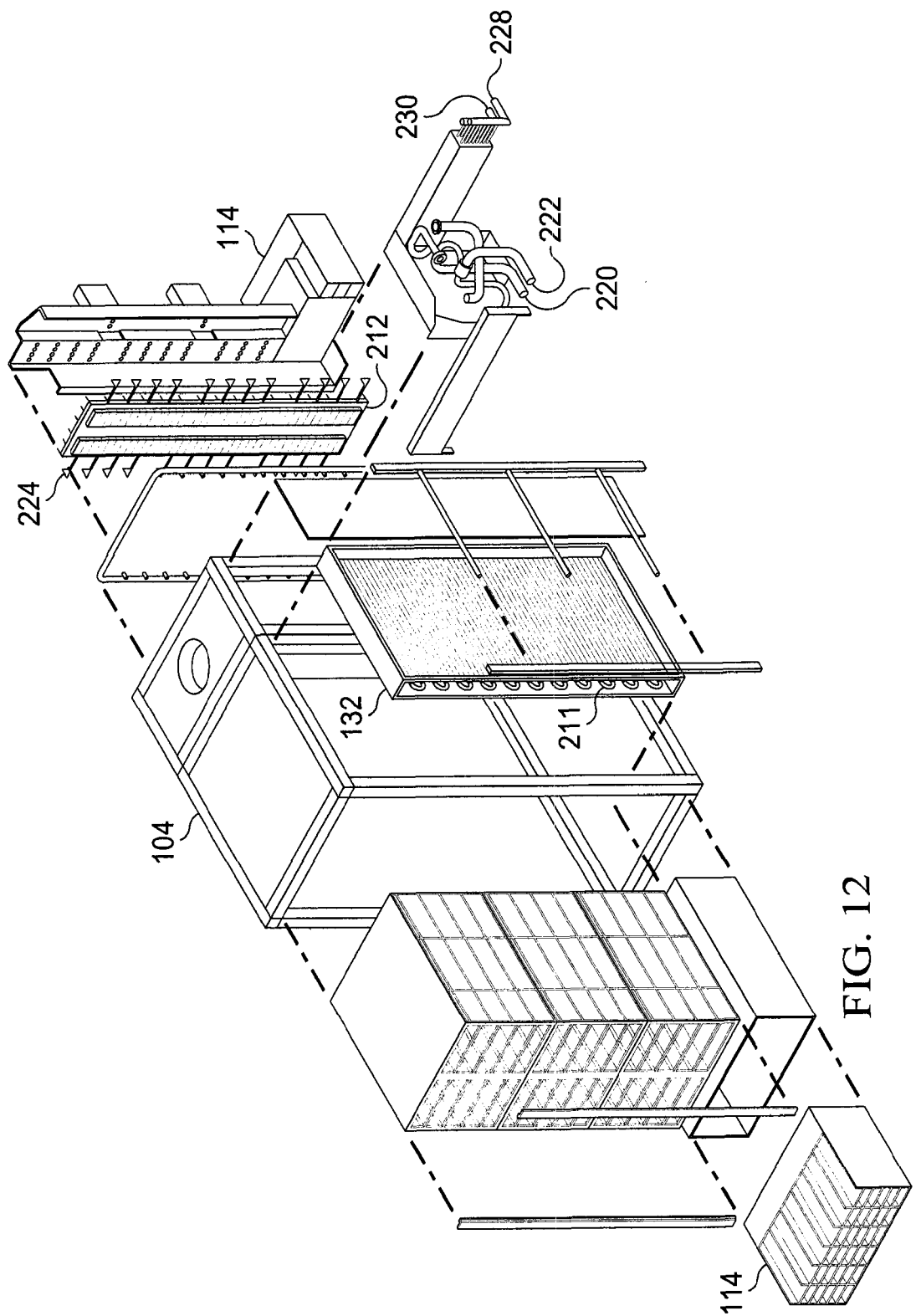
FIG. 12 depicts an exploded view of one cabinet to illustrate the vertically positioned intercooler, the chassis backplane cooling coils, and the power supply cooling coils and the various control valves.

Referring to FIGS. 11-12, FIG. 11 illustrates a system diagram of the fluid cooling system at 200. System 200 is seen to comprise a cooling fluid inlet 202 feeding main fluid loop 203, a fluid outlet 204, and a variably fluid control valve 206 associated with each cabinet and electronically controlled by a control signal 208 from a process controller 210. Each control valve 206 controls fluid flow to main fluid loop 203 associated with a cabinet, whereby valve 232 controls the portion of fluid flow through cooling loop 205, known as a manifold, and the power supply water coil 214, whereby the balance of fluid flow from main fluid loop 203 flows through intercooler 132. The coil of the intercooler 132 has an inlet 220 coupled to the main fluid loop 203, and an outlet 222 feeding fluid outlet 204. The power supply coil 214 has an inlet 228 and outlet 230 also feeding fluid outlet 204. The chassis backplanes 212 each have a plurality of left hand heat pipe fingers 224 and right hand heat pipe fingers 226 each physically and thermally coupled to the cooling loop 205. The cooling loop 205 forms a cold junction 252 for sinking heat from the optical connectors 250 via the heat pipe fingers. The flow of cooling fluid flowing proximate the cold junctions 252 of the heat pipe fingers 224 and 226 sinks heat from the chassis backplane connectors 252 via the heat pipe fingers, as will be further described shortly in reference to FIGS. 18-24.

FIG. 12 illustrates an exploded view one cabinet having a respective intercooler 132, chassis backplanes 224 supporting the plurality of electronic assemblies 192, and the associated power supply unit 114 partitioned into 2 parts as shown. Collectively, the coils of these subsystems draw all heat generated by the electronics systems 192 and the power supply unit 114 such that the system is room neutral.

Figure 13:
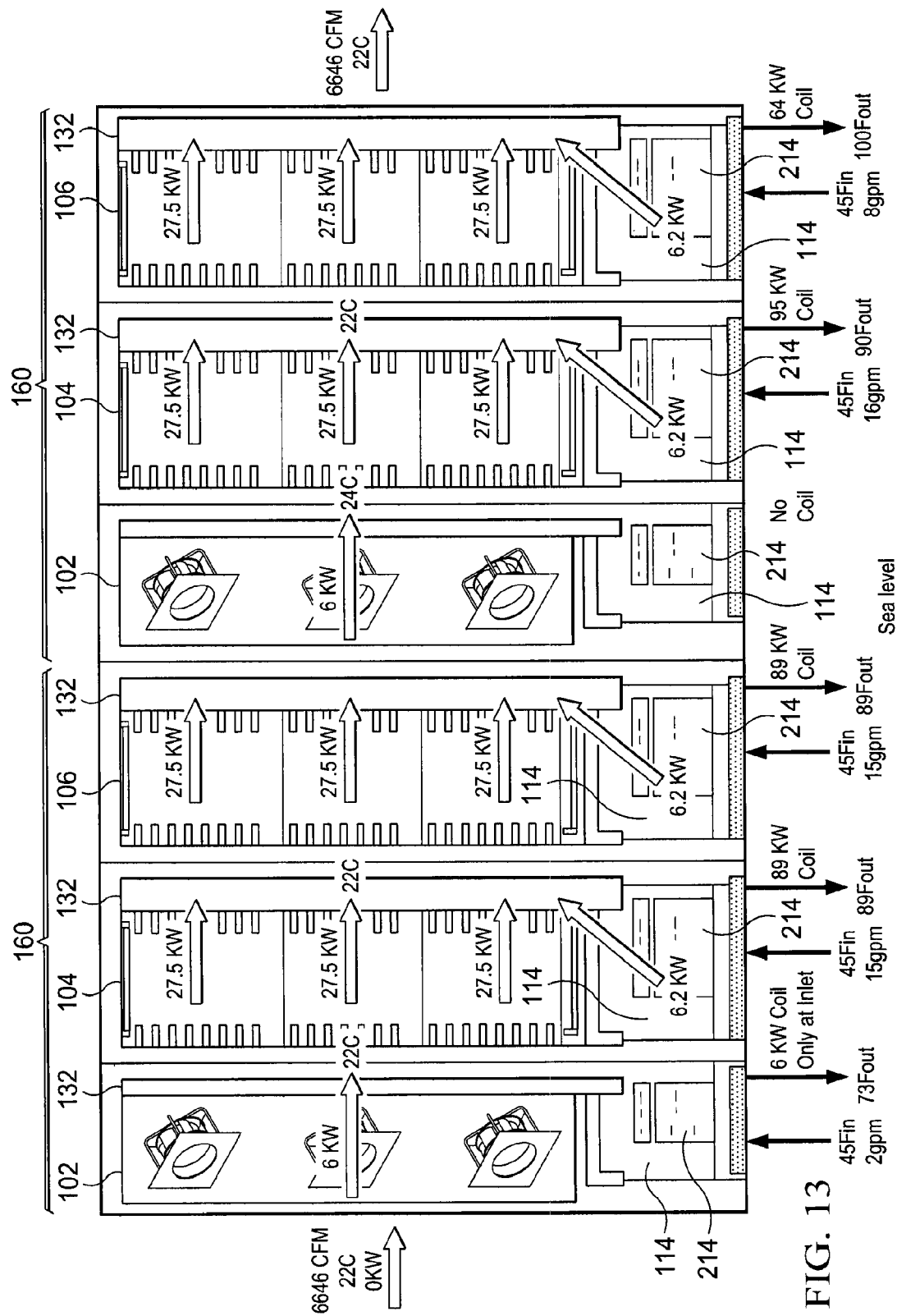
FIGS. 13 and 14 illustrate air flow through an electronics system comprising four electronics cabinets, for two different ambient conditions, whereby the electronics system is room neutral such that the ambient temperature is not increased during operation of the electronics system.
Figure 14:
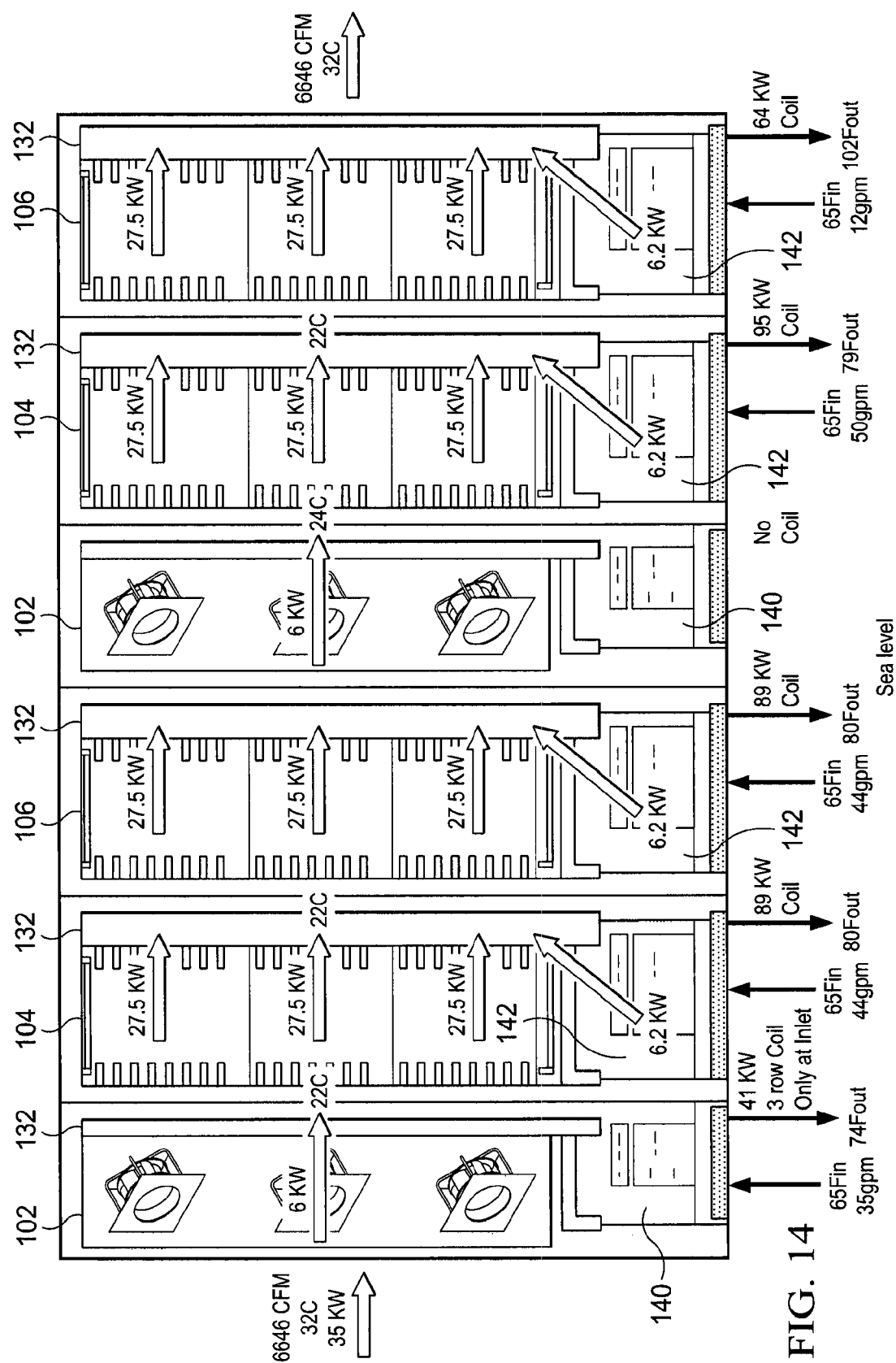

FIGS. 13 and 14 depict a pair of serially positioned electronics systems 160 of FIG. 6, in two different room neutral conditions. In the example embodiment shown in FIG. 13, the air entering blower system 102 is at 22° C., sea level, and intercoolers 132, chassis backplane coils 212, and power supply coils 214 each operate such that the collective systems 160 expel air to the ambient at 22° C., such that the complete system is room neutral. As shown, the temperature of the cooling fluid provided to each coil is 45° F., and the associated return fluid temperature of each coil and the fluid flow rate is shown. In the example shown in FIG. 14, the ambient room temperature is 32° C., sea level, and thus the fluid flow rates to the various coils are increased to maintain a room neutral system, as shown.

In the examples shown in FIGS. 13 and 14, there is no intercooler 132 to the right of the right blower 102, because there is an intercooler 132 to the left of the right blower 102, although the intercooler associated with the right blower 102 could be positioned to the right thereof if desired.

In the examples shown in FIGS. 13 and 14, the power supply coils 214 remove heat generated by the respective power supplies 114 such that the power supplies 114 don't contribute heat to the heat generated by electronics assemblies 192 above. Advantageously, this modular cooling design is configured such that the electronics assemblies 192 are thermally isolated from the power supplies 114.

In the various embodiments, a temperature sensor is positioned on or proximate on each electronics assembly 192 and used to determine the adequate flow of cooling fluid into associated intercooler 132. The controller 210 variably and responsively controls the respective valves 206 and 232 such that the thermal gradients of the respective cooling coils achieve the desired cooling. In one embodiment, the respective system may apply direct enough cooling fluid to maintain the temperature of the air exiting each intercooler at the temperature of the air going into the previous component. In another embodiment, the respective system may apply only enough water to maintain the temperature of the air exiting one or more intercoolers at a predetermined temperature higher or lower that the temperature of the air going into the previous component.

One advantage of transverse cooling is that the heat added by each cabinet is extracted soon after the air leaves the cabinet. In the examples shown in FIGS. 3, 4, 5, 6 and 11-13, the heat is extracted by an intercooler 132 as soon as the air leaves the respective cabinet. In the examples shown in FIGS. 7 and 8, the heat is extracted by an intercooler 132 as soon as the air leaves the second cabinet 106. As a result, the air exiting from each system is at or around the same temperature that it was when entering system, thus room neutral. The air leaving the system can, therefore, be used to cool the next cabinet to realize a significantly large electronics system.

Figure 15:
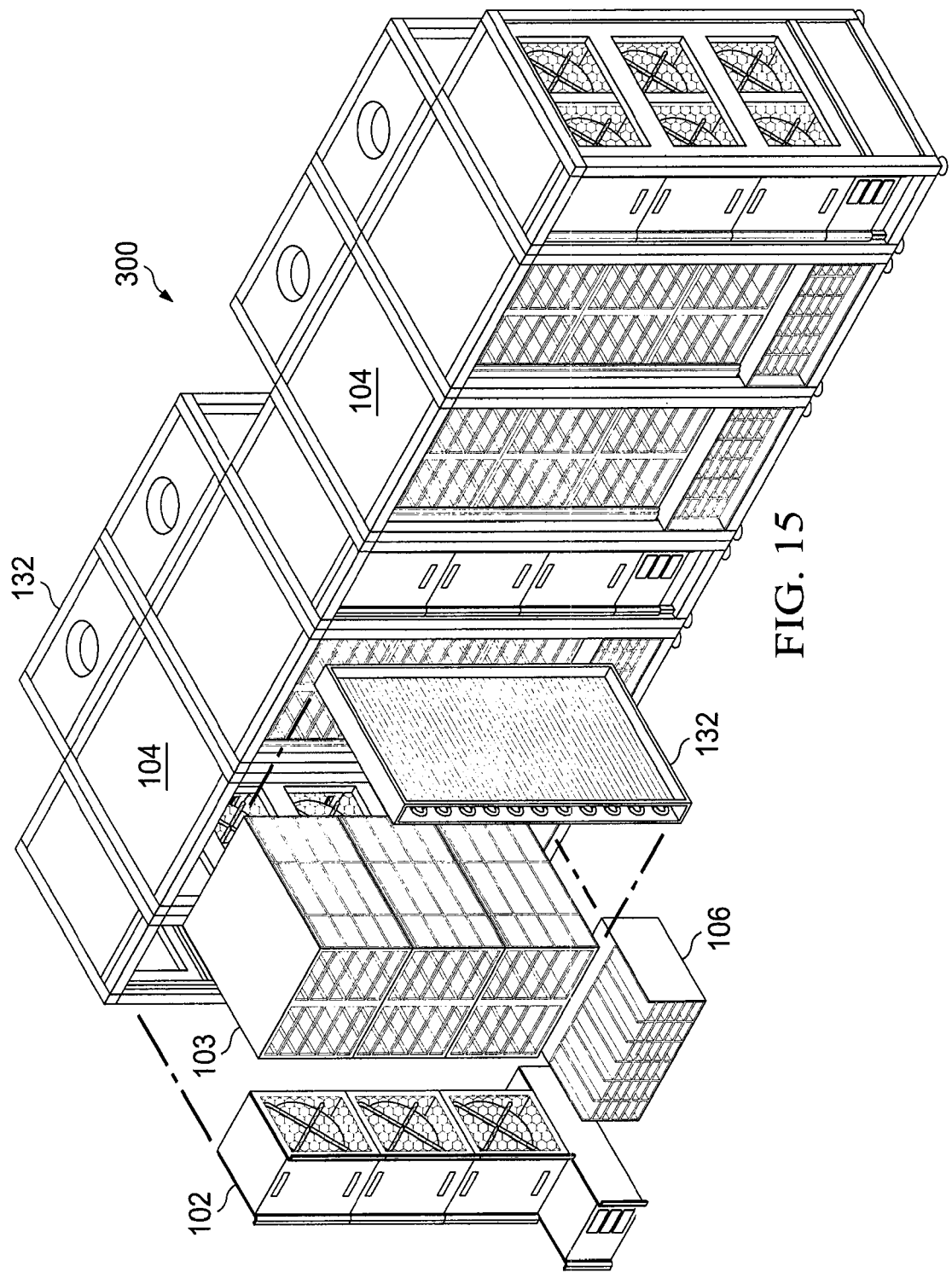
FIG. 15 illustrates an embodiment of a multi-cabinet electronics system with transverse cooling.

An example of a larger-scaled room neutral electronics system 300 comprising a single row of cabinets is shown in FIG. 15, with various components labeled for illustration. A main cooling fluid supply line 302 is shown which feeds each cabinet water inlet 202 is shown.

Figure 16:
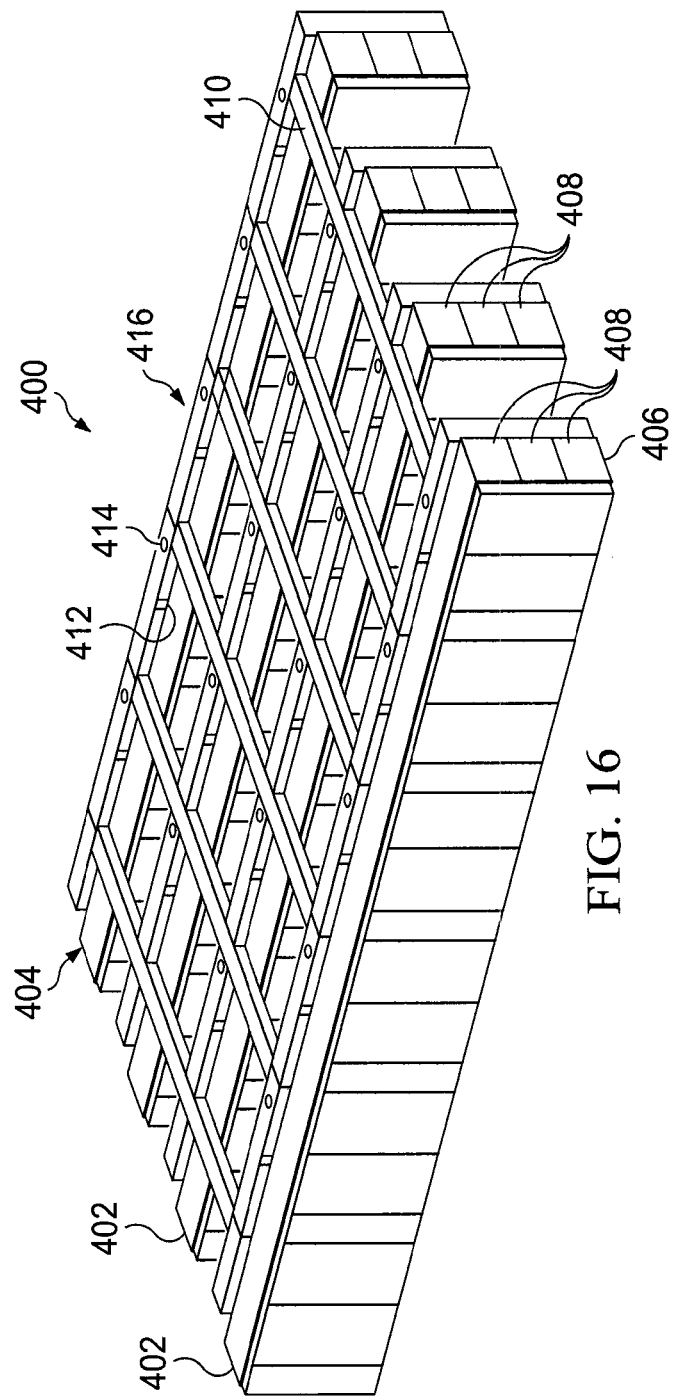
FIGS. 16 and 17 illustrate example embodiments of larger multi-cabinet electronics systems with transverse cooling.

An even larger scaled electronics system 400 with multiple rows of cabinets is shown in FIG. 16. In the example shown in FIG. 16, the computer cabinets, i.e. cabinets 104 and 106, are placed side-by-side to form a row of cabinets 402, and the rows of cabinets 402 are arranged to form an array of cabinets 404. Air is directed into a first one of the cabinets 406 in each row and flows from cabinet to cabinet down the row. In the example shown in FIG. 16, a blower intercooler combination as is shown in FIGS. 5, 6, 8, 10, 11, 12 and 13 is used to cool air received from an air intake 408 before directing the air into the row of cabinets. Water lines 302 supply water to each computer cabinet and are controlled to cool air leaving each computer cabinet to approximately the same temperature it had when entering cabinet. Cable trays 410 carry cables connecting cabinets to cabinets in other rows. Cable access openings 412 and cable exit ports 414 are used to direct and protect cables passing between rows. Air mover racks are shown at 416.

Figure 17:
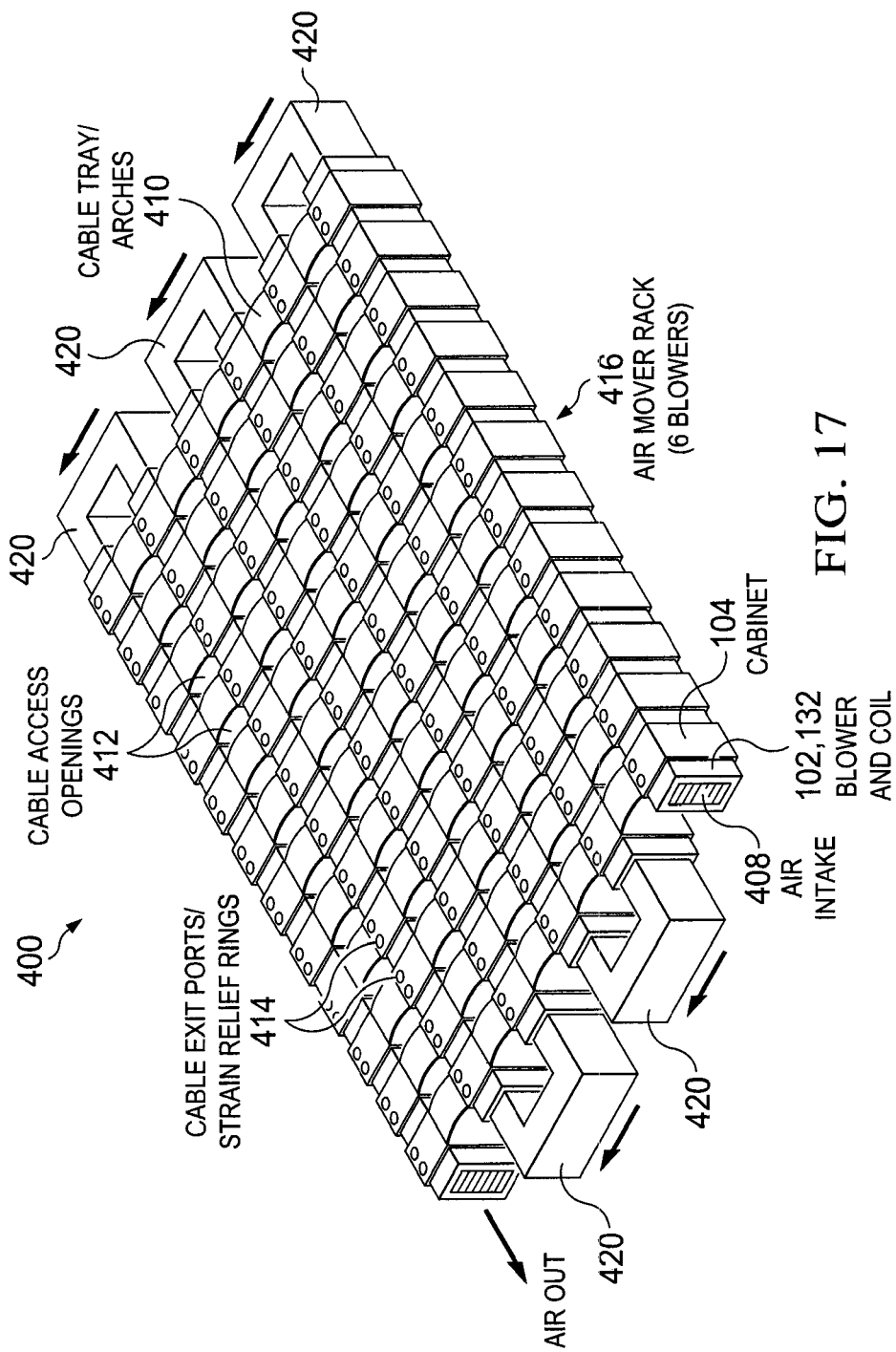

In one embodiment, an air curtain or ducting forms an air redirector 420 used to move air flowing from one row of cabinets 402 to the next row of cabinets 402, such as in a serpentine arrangement as shown in FIG. 17. In one embodiment, the systems include N+1 blower systems 102 for system configurations of N cabinets, where N is less than or equal to 6. One of the blower systems is configured as an exhaust blower cabinet.

In another embodiment, the systems include N+1 blower systems 102 for system configurations of N cabinets, where there are N cabinets in a row and where N is greater than or equal to 10. In configurations where an exhaust blower cabinet is needed, N+2 blower systems are used.

In one embodiment, the systems include sensors for monitoring system thermal conditions. In one such embodiment, the systems monitor ambient air temperature, ambient relative humidity, ambient dew point, blower status, air velocity and temperature of the air exiting intercooler assembly 132, water coil inlet water temperature, water pressure differential across the water coil, water coil outlet air temperature and water detection both in the pre-conditioner and in computer cabinet. In one embodiment, the controls include front end rectifier power good indication.

In one embodiment, the systems use water valves to control coil water flow and air exhaust temperature, to precondition incoming air and to maintain room neutral exhaust temperatures.

In one embodiment, the controllers 210 vary blower cabinet fan speed as needed. In one such embodiment, the systems increase fan speed upon fan failure to maintain air velocity. In another embodiment, the systems increase fan speed to maintain chip temperatures in electronics assemblies 192. If chip temperature exceeds a set value, the respective water valve is opened to bring the chip temperature down. If that doesn't work by itself, then the fan speed can be increased to 100% full speed.

The above described transverse cooling system and method is advantageous since it reuses air as that air passes through each cabinet. The increased cross-sectional area and the decreased pressure drop means that this method is a more efficient way of removing heat from the system. The increased cross-sectional area means that more fans can be placed in parallel. This, in turn, reduces the cost of the fans, as industry standard fans can be used instead of custom fans. It also reduces the effects of loss of a fan in blower system 102.

In addition, since, in some embodiments, air exiting each cabinet is around the same temperature as entering the cabinet, similar cabinets 104 should exhibit similar thermal profiles and have similar energy utilization. That is, the cooling system is room neutral. Unconditioned and unfiltered air can be used.

Transverse cooling shows a dramatic increase in cooling efficiency. In one example embodiment, cooling energy dropped to 3% of total system power. This approach eliminates the need for conditioning and filtering air in the room in which systems are placed, relaxing computer room environmental requirements. The increased cross-sectional area of air flow reduces the effect of failures in any one fan, or in any one component of the cooling system, increasing system reliability.

Figure 18:
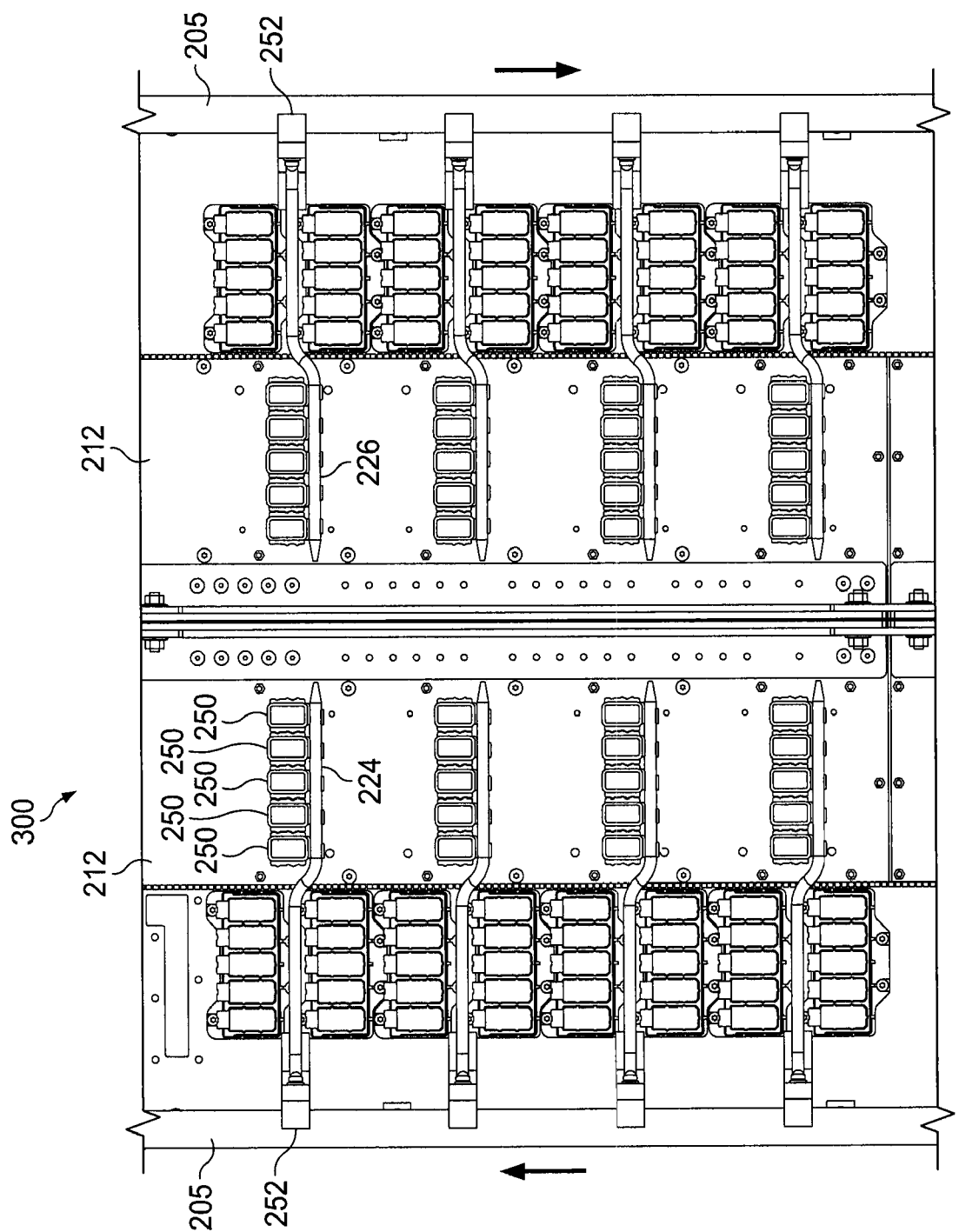
FIG. 18 illustrates an enlarged view of the heat pipe fingers shown in FIG. 11, each extending from the cooling pipe to backplane connectors.

Referring now to FIG. 18, there is shown an enlarged view of the chassis backplanes 212 of FIG. 11 having the associated connectors 250 disposed therethrough and configured to receive electrical and/or optical cables, commonly known as vertical CXP connectors. A cooling system 300 according to a preferred embodiment of the invention is shown, including an associated heat sink finger comprising heat pipe finger 224 and 226 physically and thermally coupled to the each of the respective CXP connectors 250, such as via a clip or bracket as will be described shortly, and to the cooling loop 205 via the cold junctions 252. Each heat pipe finger 224 and 226 is coupled to the respective connectors 250 and is configured to sink heat therefrom, and transfer the sinked heat to the cold junctions 252 of cooling loop 205 or manifold as previously described with reference to FIG. 11. The heat drawn to the cold junctions 252 is then sinked/transferred to the fluid flowing through the cooling loop 205 and extracted from the system. In the embodiment as shown, each heat pipe finger is coupled to five connectors 250, although more or less connectors can be coupled to a single heat pipe finger depending on the thermal design.

Advantageously, the connector cooling system 300 is configured to keep the case temperature of the connectors 250 less than 70 C with the connectors generating 4 Watts, allowing the overall system to remain room neutral within +/−10%. The connector temperature may be maintained at a lower temperature, and the connectors may generate between 2-10 Watts, depending on the connector and application. The heat pipe fingers, connector clips, and cold junction couplers do not interfere with electrical or optical cables routed to the connectors 250. The cooling system 300 is passive and does not require power, control or monitor additional hardware. The cooling system does not create main cabinet cooling system air leaks, and is separate from the air flow envelope, such as the transverse cooling system previously described. The cooling system takes advantage of the cooling fluid, such as water, brought to every cabinet. One goal is to allow as high temperature of the cooling fluid as possible, such as 70 F (21 C). Cooling system 300 effectively maintains the connector temperature at 70F when operating with this cooling fluid temperature.

Figure 19:
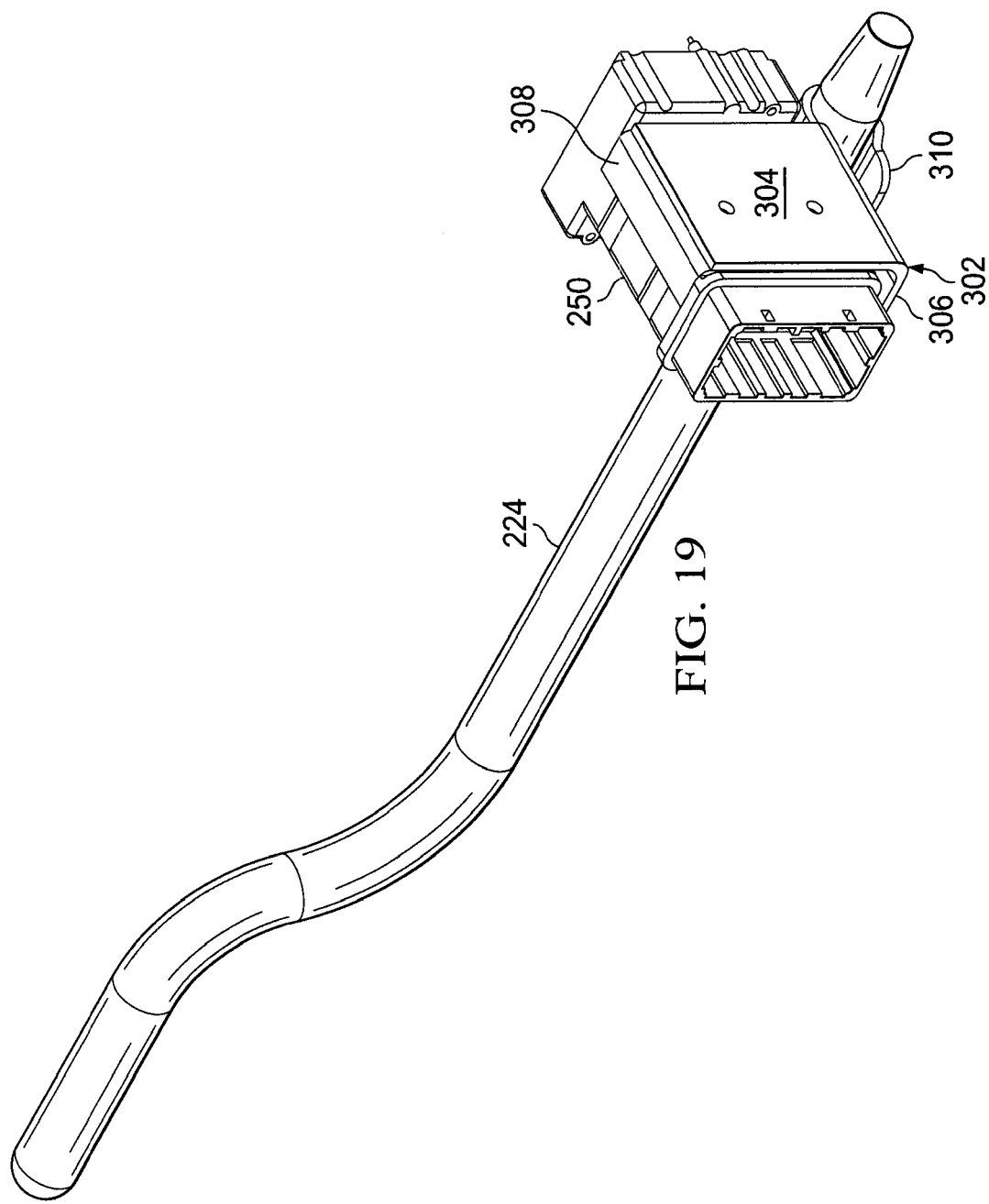
FIG. 19 is a perspective view of one clip connector secured about an optical connector, and including a heat pipe drawing heat from the optical connector for routing to a cold junction of a cooling system.
Figure 20B:
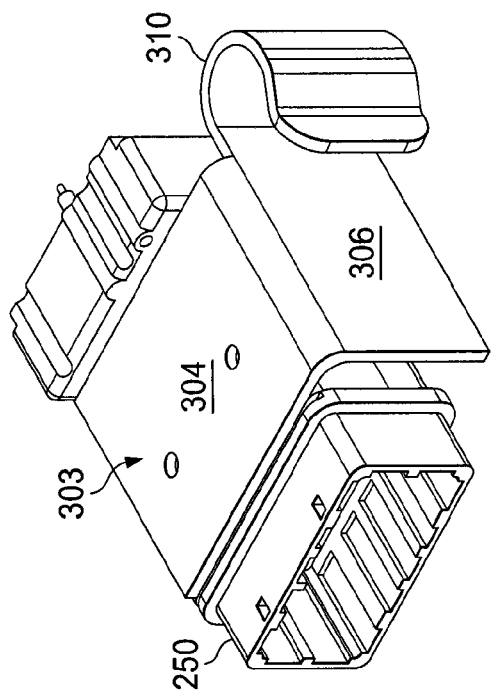
FIG. 20B is a perspective view of the rotated clip connector of FIG. 20A.
Figure 20C:
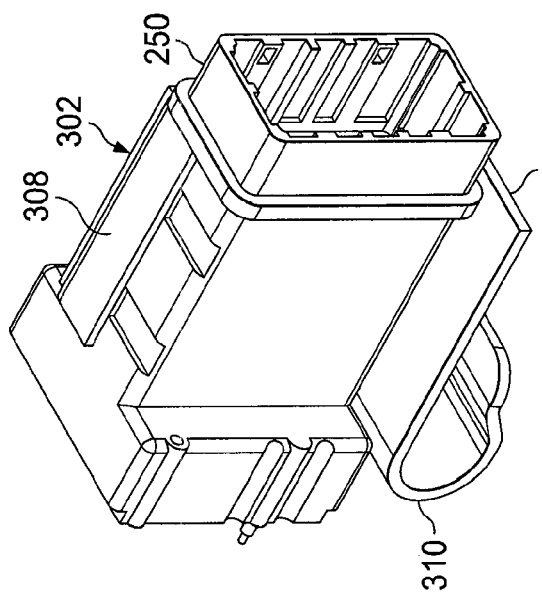
FIG. 20C is an opposite side perspective view of the clip connector of FIG. 20A.
Figure 20A:
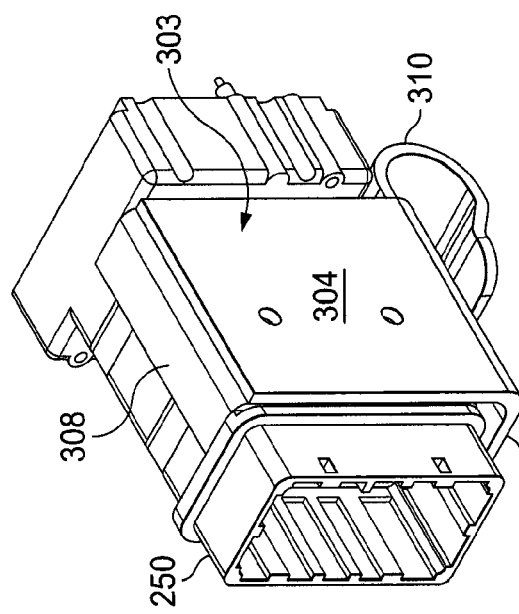
FIG. 20A is a perspective view of the clip connector secured about the optical connector.
Figure 21B:
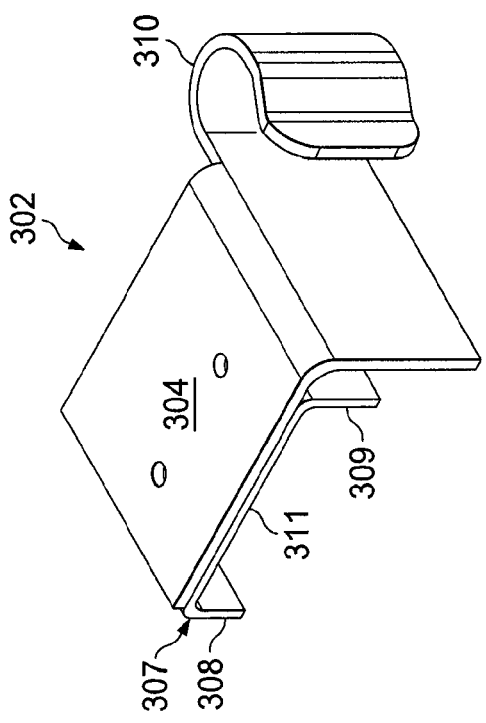
FIGS. 21A, 21B and 21C are views of the clip connector.
Figure 21C:
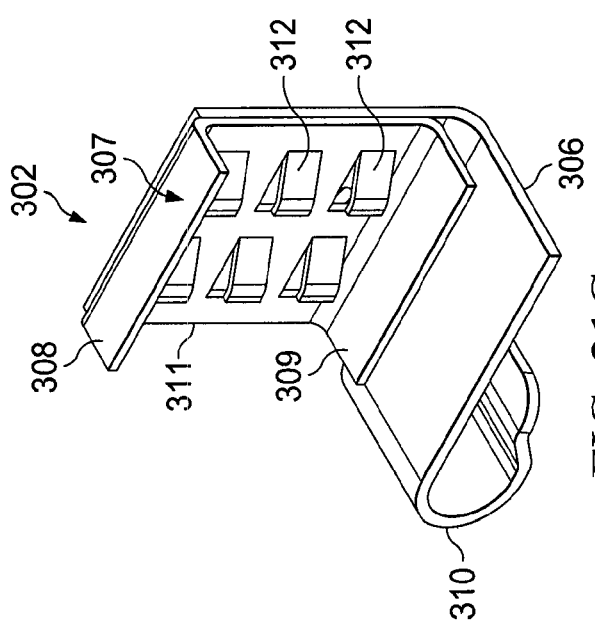
Figure 21A:
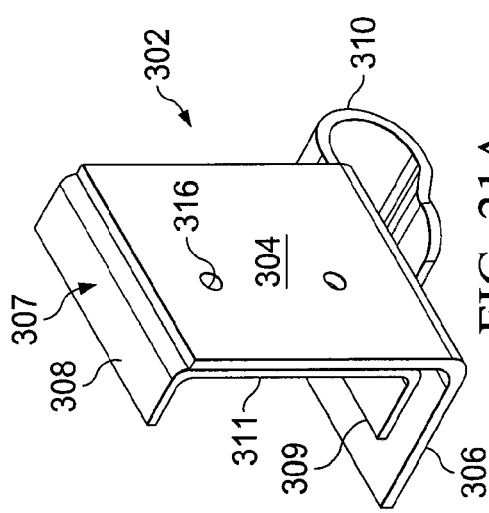

Referring to FIG. 19, there is shown an enlarged view of one active optical connector (AOC) 250 physically and thermally coupled to a heat pipe finger 224 via a CXP clip connector 302. FIGS. 20A, 20B and 20C show the CXP clip connector 302 secured about the AOC 250 without the heat pipe finger 224, and FIGS. 21A, 21B and 21C show the CXP clip connector 302 alone. Connector 302 is comprised of a thermally conductive material, such as copper or an alloy, and comprises an integral L-shaped member 303 having a planar side member 304 and a base member 306. A bracket 307 having a planar top member 308, planar bottom member 309 and a joining intermediate planar side wall 311 having a plurality of inwardly extending spring fingers 312, is physically and thermally joined to member 303. The planar opposing major surfaces of member 304 and side wall 311 are physically and thermally joined to have excellent heat transfer characteristics, and may be joined via fasteners disposed through openings 316, or bonding such as brazing. The bracket base member 309 and top member 308 each form an opposing spring that are slightly resilient and configured to securely snap fit about and engage the back shell of the AOC connector 250, whereby the spring fingers 312 physically and thermally engages the opposing major side wall of the connector 250 back shell. The tension of the spring base member 309 and top member 308 provides a force that secures the connector 302 to the AOC 250 back shell, such that base member 308, top member 309 and intermediate side wall 311/side member 304 efficiently sink heat from the back shell of connector 250 during operation of the connector 250. An integral clip 310 extends from base member 306 and is configured to physically and thermally receive the associated heat pipe finger 224, whereby the heat in the AOC connector 250 is sunk by the connector 302 to the heat pipe finger 224 via clip 310. Side member 304 is comprised of a planar heat spreader, such as a copper plate of suitable thickness, and is configured to efficiently sink heat from the connector 250 back shell via bracket 311 including the spring fingers 312. Advantageously, the Case to Pipe Resistance of the CXP connector 302 is about 4 C/W. The Case is the AOC 250 back shell temperature, and the Pipe is the temperature of the heat pipe 224 on the cold junction side of the clip connector 302.

Figure 22A:
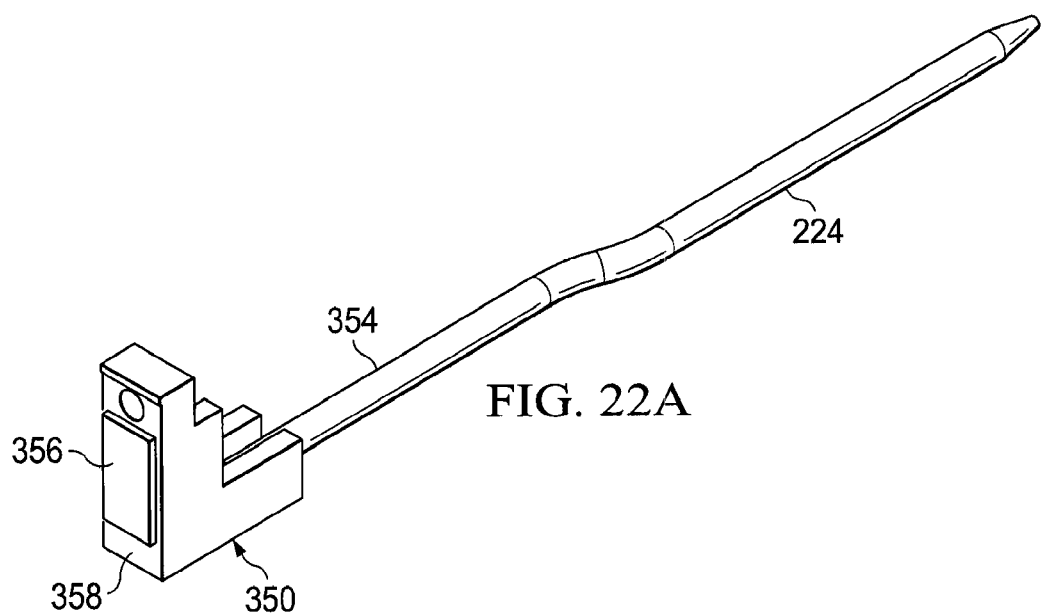
FIG. 22A is a perspective view of a left hand heat pipe attached to a cold junction bracket including a thermal filler.
Figure 22B:
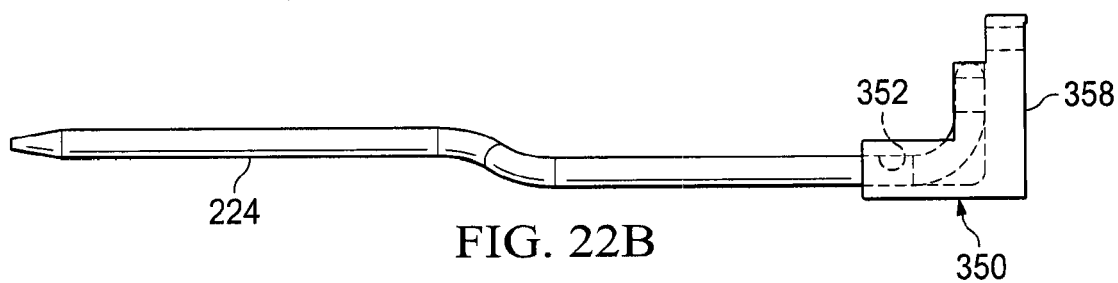
FIG. 22B is a side view of the heat pipe and cold junction bracket of FIG. 22A.
Figure 22C:
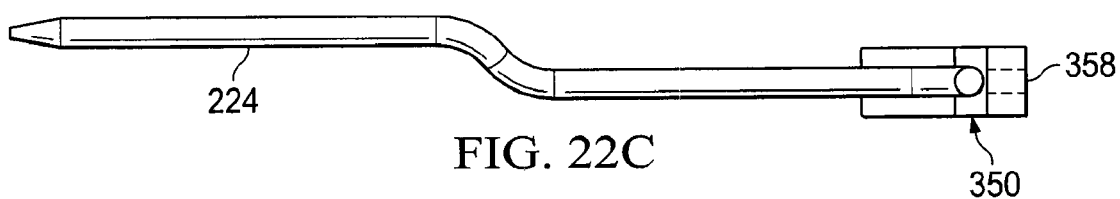
FIG. 22C is a top view of the heat pipe and cold junction bracket of FIG. 22A.

Referring now to FIGS. 22A, 22B and 22C there is shown one left hand heat pipe finger 224 thermally and physically coupled to, and received by, a cold junction connector 350. The cold junction connector 350 has an opening 352 securely receiving a proximal end 354 of the heat pipe finger 224. A thermal filler material 356 is secured to an end face 358 of the connector 350, and is configured to be interposed between the connector 350 and the cold junction 252 of cooling loop 205. A preferred thermal filler material 356 is TFLEX 640-DC1 available from Laird Tech, although other suitable thermal filler materials, such as thermal grease, are suitable as well.

Figure 23A:
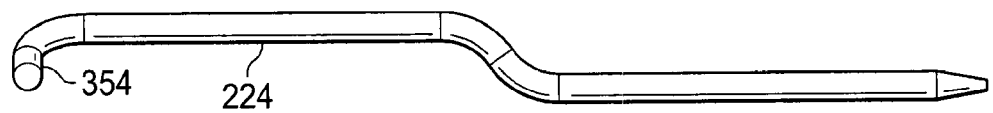
FIG. 23A is a side view of the heat pipe of FIG. 22A.
Figure 23B:
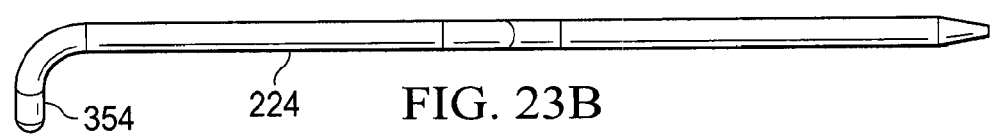
FIG. 23B is another view of the heat pipe of FIG. 22A.

FIGS. 23A and 23B show views of the heat pipe finger 224 alone. A heat pipe is a heat-transfer device that combines the principles of both thermal conductivity and phase transition to efficiently manage the transfer of heat between two solid interfaces. At the hot interface within a heat pipe, which is typically at a very low pressure, a liquid in contact with a thermally conductive solid surface turns into a vapor by absorbing heat from that surface. The vapor then travels along the heat pipe to the cold interface, condenses back into a liquid, releasing the latent heat. The liquid then returns to the hot interface through either capillary action or gravity action where it evaporates once more and repeats the cycle. In addition, the internal pressure of the heat pipe can be set or adjusted to facilitate the phase change depending on the demands of the working conditions of the thermally managed system.

A typical heat pipe consists of a sealed pipe or tube made of a material with high thermal conductivity such as copper or aluminum at both hot and cold ends. A vacuum pump is used to remove all air from the empty heat pipe, and then the pipe is filled with a fraction of a percent by volume of working fluid (or coolant) chosen to match the operating temperature. Alternatively, the pipe is heated until the fluid boils, and sealed while hot. Examples of such fluids include water, ethanol, acetone, sodium, or mercury. Due to the partial vacuum that is near or below the vapor pressure of the fluid, some of the fluid will be in the liquid phase and some will be in the gas phase. The use of a vacuum eliminates the need for the working gas to diffuse through any other gas and so the bulk transfer of the vapor to the cold end of the heat pipe is at the speed of the moving molecules. In this sense, the only practical limit to the rate of heat transfer is the speed with which the gas can be condensed to a liquid at the cold end.

Inside the pipe's walls, an optional wick structure exerts a capillary pressure on the liquid phase of the working fluid. This is typically a sintered metal powder or a series of grooves parallel to the pipe axis, but it may be any material capable of exerting capillary pressure on the condensed liquid to wick it back to the heated end. The heat pipe may not need a wick structure if gravity or some other source of acceleration is sufficient to overcome surface tension and cause the condensed liquid to flow back to the heated end.

Referring now to FIGS. 24A, 24B and 24C there is shown one right hand heat pipe finger 226 thermally and physically coupled to, and received by, a cold junction connector 350. The cold junction connector 350 has an opening 352 securely receiving a proximal end 354 of the heat pipe finger 226. A thermal filler material 356 is secured to an end face 358 of the connector 350, and is configured to be interposed between the connector 350 and the cold junction 252 of cooling loop 205. A preferred thermal filler material 356 is TFLEX 640-DC1 available from Laird Tech, although other suitable thermal filler materials, such as thermal grease, are suitable as well. FIGS. 25A and 25B show views of the heat pipe finger 226 alone.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:
1. A system, comprising:
 a cabinet configured to receive a plurality of electronics assemblies;
 a backplane having at least one electronic connector configured to route signals to the electronics assemblies;
 a frame member comprising a cold junction and a conduit configured to route a cooling fluid therethrough; and at least one heat sink finger physically and thermally coupled to, and extending between, the at least one electronic connector and the frame member cold junction, the at least one heat sink finger configured to sink heat from the at least one electronic connector to the frame member, wherein a clip connector physically and thermally couples the at least one electronic connector to the at least one said heat sink finger.

2. The system as specified in claim 1 further comprising a mounting member physically and thermally coupled to the conduit, the mounting member securely receiving the at least one heat sink finger.

3. The system as specified in claim 1 wherein the at least one heat sink finger comprises an elongated heat pipe finger.

4. The system as specified in claim 1 further comprising a plurality of said electronic connectors disposed proximate one another and coupled to the backplane, said at least one heat sink finger physically and thermally coupled to each of the plurality of electronic connectors and configured to sink heat therefrom and to the fluid in the conduit.

5. The system as specified in claim 4 wherein the at least one heat sink finger comprises an elongated member extending adjacent each of the plurality of electronic connectors and terminating at the conduit.

6. The system as specified in claim 5 further comprising a plurality of clip connectors, one said clip connector physically and thermally coupled to each of the plurality of electronic connectors, each said clip connector physically and thermally sinking heat generated by the respective electronic connector to the fluid in the conduit.

7. The system as specified in claim 6 wherein each said clip connector encloses the respective said electronic connector.

8. The system of claim 1, further comprising a blower configured to direct air into the cabinet and configured to direct the air across the plurality of electronics assemblies, wherein the conduit is also configured to sink heat from the air after it is directed across the plurality of electronics assemblies.

9. The system as specified in claim 8, further comprising an intercooler coupled to the conduit and configured to transfer the air directed there through and extract heat in the air generated by the electronics assemblies.

10. The system of claim 9 wherein the blower and the intercooler are configured such that a temperature of air drawn into the cabinet is generally the same as a temperature of the air expelled from the cabinet.

11. The system as specified in claim 8 wherein the blower is configured to direct the air across the plurality of electronics assemblies in a substantially horizontal direction.

12. The system of claim 1 further comprising at least one valve selectively controllable by a controller and configured to variably control a fluid rate of the fluid directed through the conduit.

13. The system of claim 1 wherein said clip connector is a CXP type bracket.

14. The system as specified in claim 1 wherein the at least one electronic connector comprises a back shell, and the clip connector comprises a plurality of spring fingers configured to physically and thermally engage the at least one electronic connector back shell.

15. The system as specified in claim 14 wherein the clip connector has a C-shape.

16. The system as specified in claim 14 wherein the back shell to the cold junction has a resistance of no greater than about 4 C/W.

17. The system as specified in claim 14 wherein the clip connector comprises a heat spreader joined to a bracket.

18. The system as specified in claim 1 wherein the clip connector comprises a heat spreader joined to a bracket.

19. A system for managing heat generated by cabinet mounted electronic assemblies, comprising:
   a cabinet configured to receive a plurality of electronics assemblies;
   a backplane having a first set of electronic connectors configured to route signals to the electronics assemblies, the first set of electronic connectors coupled to the backplane in close proximity to one another;
   a frame member comprising a cold junction;
   a heat sink finger physically and thermally coupled to the first set of electronic connectors, and to the frame member cold junction, the heat sink finger comprises an elongated heat pipe finger configured to sink heat from each of the first set of electronic connectors to the frame member cold junctions;
   and a plurality of clip connectors, one said clip connector physically and thermally coupled to each of the plurality of electronic connectors, each said clip connector physically and thermally sinking heat generated by the respective electronic connector to the frame member cold junction via the heat sink finger.

20. The system of claim 19 wherein the heat sink finger comprises an elongated member extending adjacent the first set of electronic connectors and terminating at the frame member cold junction.

21. The system of claim 19 wherein each said clip connector encloses the respective said electronic connector.

22. The system of claim 19 further comprising a plurality of sets of connectors coupled to the backplane with each connector in each set in close proximity to one another, and a plurality of heat sink fingers ph, shy and thermally coupled to the plurality of sets of connectors, to sink heat from the electronic connectors to the frame member cold junction.

* * * * *

UNITED STATES PATENT AND TRADEMARK OFFICE
CERTIFICATE OF CORRECTION

PATENT NO. : 9,185,828 B2  
APPLICATION NO. : 13/836873  
DATED : November 10, 2015  
INVENTOR(S) : Knudsen et al.

Page 1 of 1

It is certified that error appears in the above-identified patent and that said Letters Patent is hereby corrected as shown below:

In the claims

Claim 22, Col. 14, line 4, delete "ph, shy," after "fingers" and insert -- physically -- in its place.

Signed and Sealed this  
Fifteenth Day of March, 2016

Michelle K. Lee  
*Director of the United States Patent and Trademark Office*